US012740208B2

(12) United States Patent
Byun et al.

(10) Patent No.: US 12,740,208 B2
(45) Date of Patent: Sep. 15, 2026

(54) DISPLAY DEVICE AND METHOD OF MANUFACTURING THE SAME

(71) Applicant: Samsung Display Co., LTD., Yongin-si (KR)

(72) Inventors: Jin-Su Byun, Seoul (KR); Woongsik Kim, Hwaseong-si (KR); Yu-Gwang Jeong, Anyang-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 937 days.

(21) Appl. No.: 17/858,504

(22) Filed: Jul. 6, 2022

(65) Prior Publication Data

US 2023/0132915 A1 May 4, 2023

(30) Foreign Application Priority Data

Oct. 28, 2021 (KR) ........................ 10-2021-0145771

(51) Int. Cl.
*H10H 20/01* (2025.01)
*H10H 20/831* (2025.01)
*H10H 20/84* (2025.01)
*H10H 20/857* (2025.01)

(52) U.S. Cl.
CPC .......... *H10H 20/857* (2025.01); *H10H 20/01* (2025.01); *H10H 20/8312* (2025.01); *H10H 20/84* (2025.01); *H10H 20/032* (2025.01); *H10H 20/034* (2025.01); *H10H 20/0364* (2025.01)

(58) Field of Classification Search
CPC .. H10H 20/857; H10H 20/01; H10H 20/8312; H10H 20/84; H10H 20/032; H10H 20/034; H10H 20/0364; H10H 29/142; H10K 59/131; H10K 59/65; H10K 59/8731; H10K 50/8445; H10K 59/12; H10K 71/00
See application file for complete search history.

(56) References Cited

U.S. PATENT DOCUMENTS 10,658,628 B2 * 5/2020 Lee ...................... H10K 59/873
2018/0342707 A1 11/2018 Lee et al.
2020/0274089 A1 * 8/2020 Son .................... H10K 59/8792
(Continued)

FOREIGN PATENT DOCUMENTS

KR 10-2018-0025054 3/2018
KR 10-2018-0130613 12/2018
KR 10-2019-0048785 5/2019
(Continued)

OTHER PUBLICATIONS

Korean Office Action dated Mar. 11, 2025, in Korean Patent Application No. 10-2021-0145771.

*Primary Examiner* — Kretelia Graham
*Assistant Examiner* — Nkechinyere Esiaba
(74) *Attorney, Agent, or Firm* — Harness, Dickey & Pierce, P.L.C.

(57) ABSTRACT

A display device comprises a transistor layer that includes a display area and a pad area disposed adjacent to the display area, an emission layer disposed in the display area on the transistor layer, a first display insulating layer disposed on the emission layer, and an insulating layer disposed in the pad area on the transistor layer, the insulating layer and the first display insulating layer including a same material, and the insulating layer having a step.

9 Claims, 18 Drawing Sheets

(56) References Cited

U.S. PATENT DOCUMENTS

2021/0036076 A1 2/2021 Kim et al.

FOREIGN PATENT DOCUMENTS

| | | | | | |
|---|---|---|---|---|---|
| KR | 20190048785 | A | * | 5/2019 | ........... G06F 3/0412 |
| KR | 10-2032748 | | | 10/2019 | |
| KR | 10-2094143 | | | 3/2020 | |
| KR | 10-2020-0118266 | | | 10/2020 | |
| KR | 20200118266 | A | * | 10/2020 | ............. H10K 71/00 |
| KR | 10-2021-0014233 | | | 2/2021 | |
| KR | 10-2021-0020188 | | | 2/2021 | |

* cited by examiner

SA
DA
SIL5
SIL4
SOC
SGR
SIL2
SIL1
SPDL
SVIA
BFR
BRR2
PI2
BRR1
PI1
III'
SGI
SILD
DIL5
DIL4
DIL2
UPOL
UPOC
DOL
SGR
DIL1
PDL
VIA
ILD
GI
III
D1
D2
D3

DOC'
DIL3
DIL2
DOL
DIL1
CTE
PDL
TL
EL
ADE
I
I'
LPE
POC'
IL3'
IL2'
IL1'
TL
II
II'
UPOC'
UPOL
DOL
SOC'
SIL2
SIL1
SPDL
SVIA
SILD
SGI
PI2
BRR1
PI1
BRR2 BFR
III
III'

SIL4
SOC
SIL2
SIL1
SPDL
SVIA
SILD
SGI
PI2
BRR1
PI1
III'
BRR2 BFR
DOL
III
IL4'
IL3
IL2
IL1''
TL
II'
OPN1
LPE
II
I'
EL
ADE
DIL4'
TM1
DIL3
DIL2
DOL
DIL1
CTE
PDL
TL
I

LRF HRF TM2 DIL5 DIL4 TM1 DIL3 DIL2 DOL DIL1 CTE PDL TL EL ADE I I'

IL4 IL3 IL2 IL1 TL LPE UPE PE II II'

SIL5 SIL4 SOC SIL2 SIL1 SPDL SVIA SILD SGI PI2 BRR1 PI1 BRR2 BFR DOL III III'

20
LRF
TM2
DIL5
DIL4
TM1
DOC
DIL3
DIL2
DOL
DIL1
CTE
PDL
TIL
HRF
EL
ADE
I
I'
II
II'
IL4
POC
IL3
IL2
IL1
TIL
LPE
UPE
PE
UPOC
UPOL
DOL
SIL5
SIL4
SDC
SIL2
SIL1
SPDL
SVIA
SILD
SGI
PI2
BRR1
PI1
BRR2
BFR
III
III'

DISPLAY DEVICE AND METHOD OF MANUFACTURING THE SAME

CROSS REFERENCE TO RELATED APPLICATION(S)

This application claims priority to and benefits of Korean Patent Application No. 10-2021-0145771 under 35 U.S.C. § 119, filed on Oct. 28, 2021, in the Korean Intellectual Property Office, the entire contents of which are incorporated herein by reference.

BACKGROUND

1. Technical Field

The embodiments relate to a display device and a method of manufacturing the display device.

2. Description of the Related Art

An organic light emitting display device including an organic light emitting layer has low power consumption, high luminance, and high response rate. However, the organic light emitting layer is vulnerable to moisture and oxygen and may be easily damaged. Accordingly, penetration of moisture and oxygen into the organic light emitting layer may be prevented by using an inorganic layer included in the organic light emitting display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device.

Embodiments provide a method of manufacturing the display device.

A display device according to an embodiment may include a transistor layer including a display area and a pad area disposed adjacent to the display area, an emission layer disposed in the display area on the transistor layer, a first display insulating layer disposed on the emission layer, and an insulating layer disposed in the pad area on the transistor layer, the insulating layer and the first display insulating layer including a same material, and the insulating layer having a step.

In an embodiment, the insulating layer may have a first thickness and a second thickness smaller than the first thickness. The step may be a difference between the first thickness and the second thickness. The first display insulating layer may have the first thickness.

In an embodiment, the first thickness may be in a range of about 1 um to about 1.5 um. The second thickness may be in a range of about 0.3 um to about 0.8 um.

In an embodiment, the transistor layer may include a lower electrode disposed in the pad area. An opening overlapping the lower electrode in a plan view may be defined in the insulating layer.

In an embodiment, a thickness of the insulating layer may decrease discontinuously towards the opening.

In an embodiment, the display device may further include an upper electrode disposed on the insulating layer and electrically contacting the lower electrode through the opening.

In an embodiment, the display device may further include a display organic insulating layer disposed on the first display insulating layer, and an overcoat layer having an upper surface lower than an upper surface of the display organic insulating layer. The display area may include a hole area and a surround area surrounding the hole area. The overcoat layer may be disposed in the surround area on the transistor layer.

In an embodiment, the display device may further include a second display insulating layer disposed on the display organic insulating layer and a second surround insulating layer disposed under the overcoat layer, the second surround insulating layer and the second display insulating layer including a same material.

In an embodiment, the display device may further include a bending insulating layer disposed in a bending area, the bending insulating layer and the insulating layer including a same material of the insulating layer, and a refractive member disposed on the first display insulating layer, the refractive layer including an organic material. A groove that accommodates the refractive member may be disposed in the bending insulating layer.

A method of manufacturing a display device according to an embodiment may include forming a transistor layer that includes a display area and a pad area, the pad area disposed adjacent to the display area, forming an emission layer in the display area on the transistor layer, forming a first display insulating layer on the emission layer, forming a preliminary insulating layer in the pad area on the transistor layer, the preliminary insulating layer and the first display insulating layer including a same material, forming an intermediate insulating layer by partially etching the preliminary insulating layer in a thickness direction the intermediate insulating layer having a step, and forming an insulating layer by etching the intermediate insulating layer in the thickness direction.

In an embodiment, the forming of the preliminary insulating layer and the forming of the first display insulating layer may be performed together.

In an embodiment, the forming of the preliminary insulating layer and the forming of the first display insulating layer may be performed without using a mask.

In an embodiment, each of the preliminary insulating layer and the first display insulating layer may have a first thickness. The intermediate insulating layer may have the first thickness and a second thickness smaller than the first thickness. The step may be a difference between the first thickness and the second thickness.

In an embodiment, an etching amount of the preliminary insulating layer determines the step.

In an embodiment, the transistor layer may include a lower electrode disposed in the pad area. The etching of the intermediate insulating layer may expose the lower electrode of the transistor layer.

In an embodiment, the method may further include forming a display organic insulating layer on the first display insulating layer, and forming a preliminary overcoat layer having an upper surface higher than an upper surface of the display organic insulating layer. The display area may include a hole area and a surround area, the surround area surrounding the hole area. The preliminary overcoat layer may be formed in the surround area on the transistor layer.

In an embodiment, the method may further include forming an overcoat layer having an upper surface lower than the upper surface of the display organic insulating layer, by partially removing the preliminary overcoat layer.

In an embodiment, the forming of the overcoat layer may include removing the preliminary overcoat layer formed in the display area.

A display device according to embodiments may include an emission layer and an insulating layer disposed on the emission layer. The insulating layer may protect the emission layer and may expose a pad electrode. In the method of manufacturing the display device, the insulating layer may be formed without using a mask. Accordingly, productivity of the display device may be improved. A shadow generated by the mask may not be formed. Accordingly, since processes to prevent film lifting phenomena due to the shadow is not required, the dead space of the display device may be reduced. The cost associated with the mask (e.g., the cost of manufacturing the mask, the cost of managing the mask, etc.) may be reduced.

It is to be understood that both the foregoing general description and the following detailed description are examples and are intended to provide further explanation of the embodiments as claimed in this disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
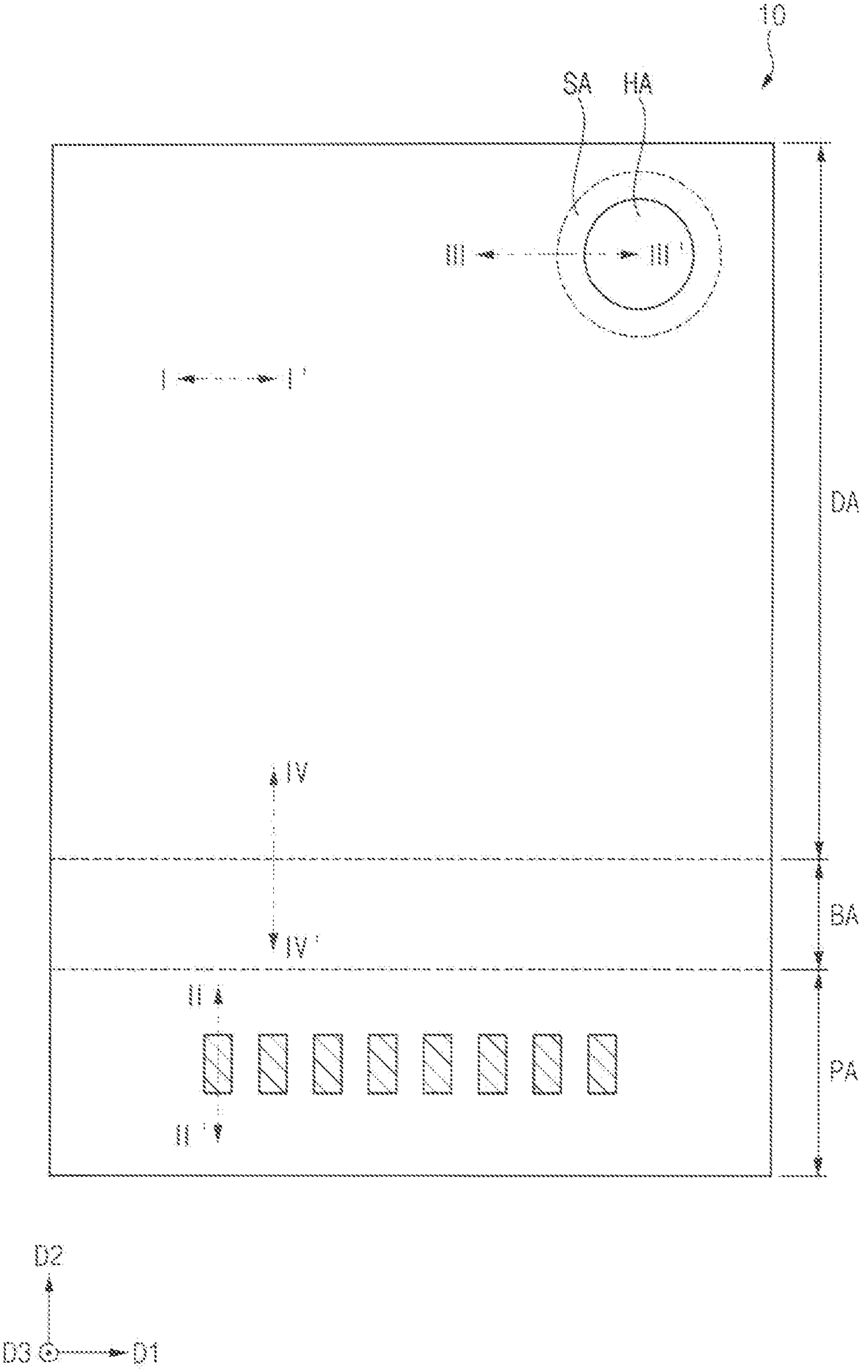
FIG. 1 is a schematic plan view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment.

Referring to FIG. 1, a display device 10 according to an embodiment may be divided into a display area DA, a bending area BA, and a pad area PA. The display area DA may include a hole area HA and a surround area SA.

An image may be displayed in the display area DA. In an embodiment, a transistor (e.g., a transistor TFT in FIG. 3) and an emission layer (e.g., an emission layer EL in FIG. 2) electrically connected to the transistor TFT may be disposed in the display area DA. The transistor TFT may supply a driving current to the emission layer EL, and the emission layer EL may emit light based on the driving current.

In an embodiment, the hole area HA may be an area through which the display device 10 passes, and the surround area SA may be positioned to surround the hole area HA.

In an embodiment, a functional module may be disposed in the hole area HA. The functional module may include a camera module for photographing (or recognizing) an image of an object located in front of the display device 10, a face recognition sensor module for detecting a user's face, a pupil recognition sensor module to detect the user's pupils, an acceleration sensor module and a geomagnetic sensor module for determining the movement of the display device 10, a proximity sensor module and an infrared sensor module for detecting whether the front surface of the display device 10 is in proximity, an illuminance sensor module to measure the degree of external brightness, etc.

In an embodiment, at least one surround groove (refer to surround groove SGR in FIG. 5) may be formed in the surround area SA. The surround groove SGR may prevent the organic layer formed in the display area DA from overflowing into the hole area HA. The surround groove SGR may prevent moisture and/or oxygen introduced through the hole area HA from penetrating into the display area DA.

In an embodiment, the bending area BA may be an area in which the display device 10 is bent. For example, the bending area BA may be positioned between the display area DA and the pad area PA.

In an embodiment, the pad area PA may be adjacent to the bending area BA. At least one pad electrode PE may be disposed in the pad area PA. For example, a driving chip may be disposed on the pad electrode PE, and the pad electrode PE and the driving chip may be connected to each other through an anisotropic conductive film. In an embodiment, the driving chip may be stably attached to the pad electrode PE, according to the size of a step (refer to step ST in FIG. 4) defined in the pad electrode PE.

As the display device 10 is bent in the bending area BA and an image is displayed in the hole area HA and/or the surround area SA, the dead space of the display device 10 may be reduced. The dead space of the display device may be understood as areas of the display device occupied by other components where pixels may not be disposed.

Figure 2:
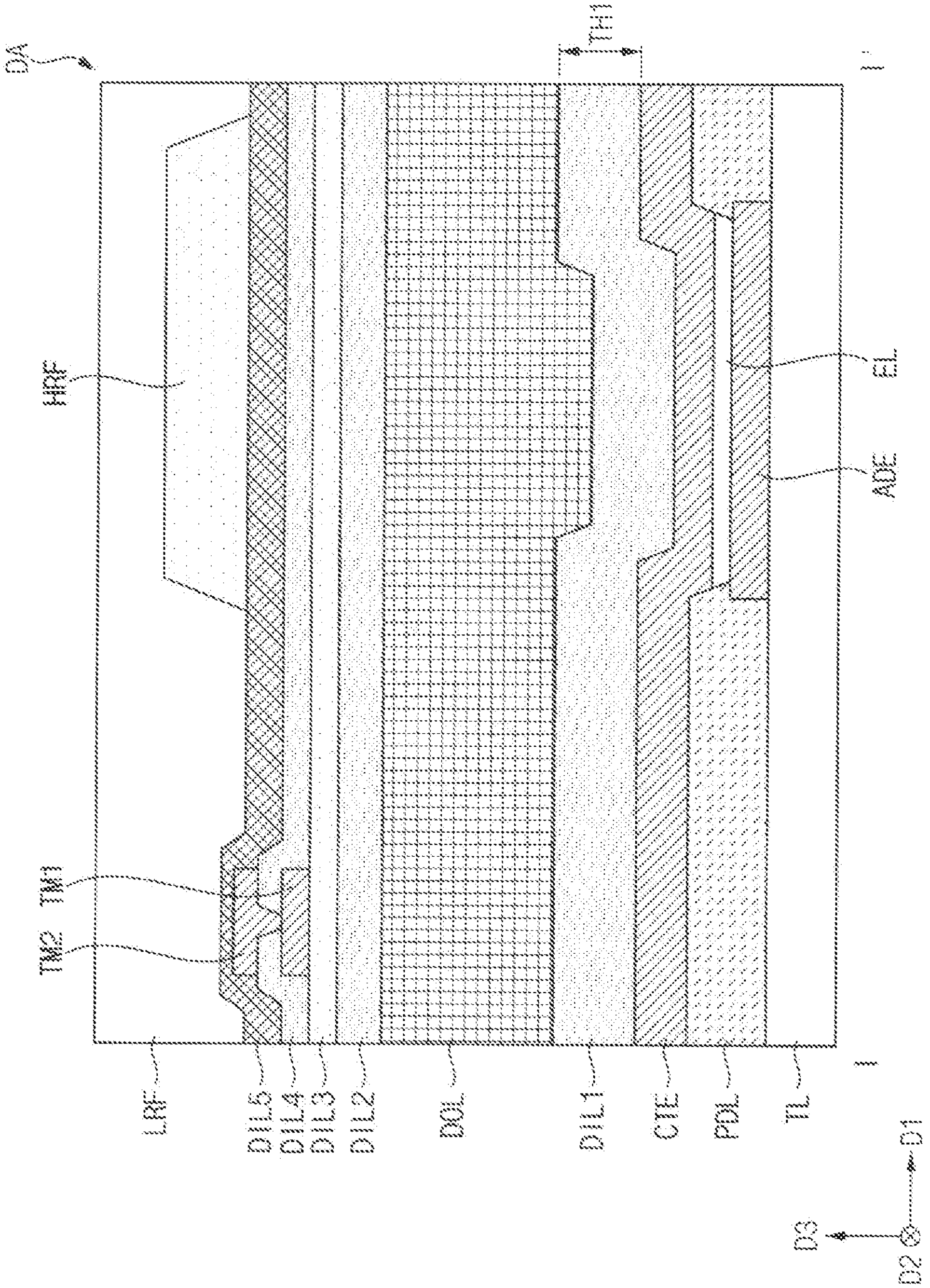
FIG. 2 is a schematic cross-sectional view taken along line I-I' of FIG. 1.
Figure 3:
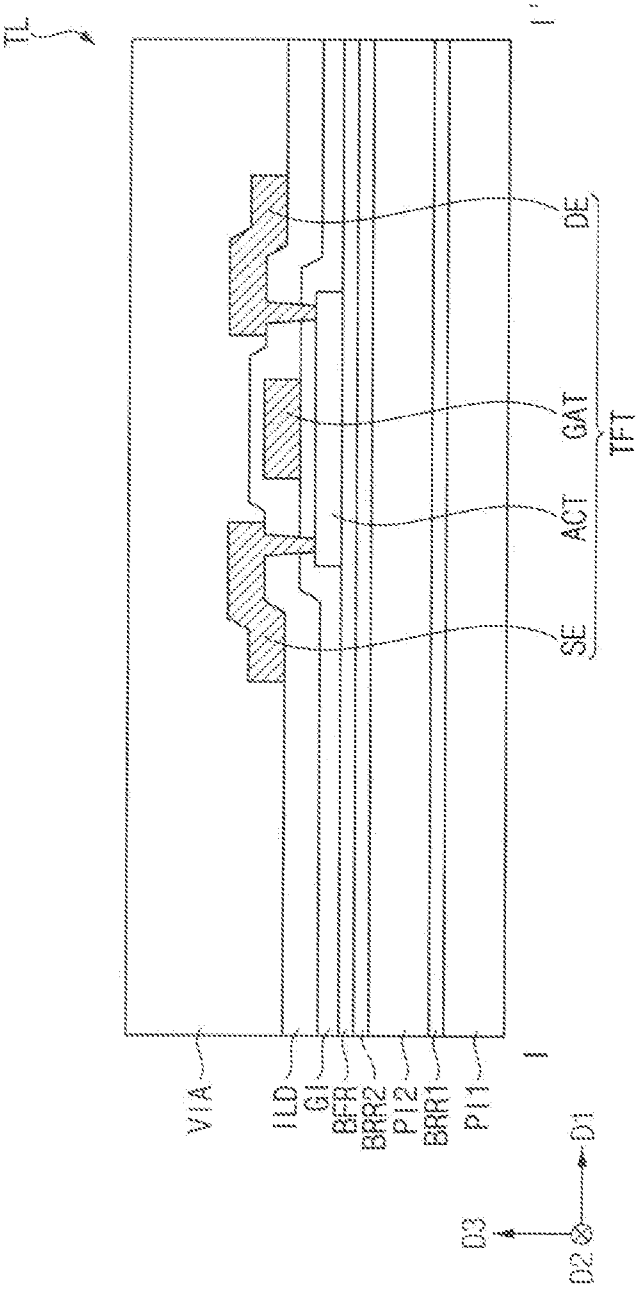
FIG. 3 is a schematic cross-sectional view illustrating a transistor layer included in the display device of FIG. 2.

FIG. 2 is a schematic cross-sectional view taken along line I-I' of FIG. 1. FIG. 3 is a schematic cross-sectional view illustrating a transistor layer included in the display device of FIG. 2. For example, FIG. 2 and FIG. 3 are schematic cross-sectional views illustrating a display area of the display device of FIG. 1.

Referring to FIG. 2, the display device 10 may include a transistor layer TL, a first electrode ADE, a pixel defining layer PDL, the emission layer EL, a second electrode CTE, a first display insulation layer DIL1, a display organic insulating layer DOL, a second display insulating layer DIL2, a third display insulating layer DIL3, a first sensing electrode TM1, a fourth display insulating layer DIL4, a second sensing electrode TM2, a fifth display insulating layer DIL5, a refractive member HRF, and a refractive layer LRF.

Referring to FIG. 3, the transistor layer TL may include a first substrate PI1, a first barrier layer BRR1, a second substrate PI2, a second barrier layer BRR2, a buffer layer BFR, an active pattern ACT, a gate insulating layer GI, a gate electrode GAT, an interlayer insulating layer ILD, a source electrode SE, a drain electrode DE, and a via insulating layer VIA.

In an embodiment, the first substrate PI1 may be formed of glass, quartz, plastic, or the like. Examples of the material that can be used as the plastic may be polyimide ("PI"), polyacrylate, polymethylmethacrylate ("PMMA"), polycarbonate ("PC"), polyethylenenaphthalate ("PEN"), polyvinylidene chloride, polyvinylidene difluoride ("PVDF"), polystyrene, ethylene vinylalcohol copolymer, polyethersulphone ("PES"), polyetherimide ("PEI"), polyphenylene sulfide ("PPS"), polyallylate, tri-acetyl cellulose ("TAC"), cellulose acetate propionate ("CAP"), and so on. These may be used individually or in combination with each other.

The first barrier layer BRR1 may be disposed on the first substrate PI1. In an embodiment, the first barrier layer BRR1 may be formed of an inorganic material. Examples of the material that can be used as the inorganic material may be silicon oxide, silicon nitride, silicon oxynitride, and the like. These may be used individually or in combination with each other.

The second substrate PI2 may be disposed on the first barrier layer BRR1. In an embodiment, the first substrate PI1 and the second substrate PI2 may include a same material.

The second barrier layer BRR2 may be disposed on the second substrate PI2. In an embodiment, the first barrier layer BRR1 and the second barrier layer BRR2 may include a same material.

The buffer layer BFR may be disposed on the second barrier layer BRR2. In an embodiment, the buffer layer BFR may be formed of an inorganic material. Examples of the material that may be used as the inorganic material may include silicon oxide, silicon nitride, silicon oxynitride, and the like. These may be used individually or in combination with each other. The buffer layer BFR may prevent metal atoms or impurities from penetrating into the active pattern ACT. The buffer layer BFR may control a heat supply rate during a crystallization process for forming the active pattern ACT.

The active pattern ACT may be disposed on the buffer layer BFR. In an embodiment, the active pattern ACT may be formed of a silicon semiconductor material or an oxide semiconductor material. Examples of the silicon semiconductor material that may be used as the active pattern ACT may be amorphous silicon, polycrystalline silicon, or the like. Examples of the oxide semiconductor material that may be used as the active pattern ACT may be IGZO (InGaZnO), ITZO (InSnZnO), and the like. The oxide semiconductor material may further include indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and zinc ("Zn"). These may be used individually or in combination with each other.

The gate insulating layer GI may be disposed on the buffer layer BFR and may cover the active pattern ACT. In an embodiment, the gate insulating layer GI may be formed of an insulating material. Examples of the insulating material that can be used as the gate insulating layer GI may be silicon oxide, silicon nitride, silicon oxynitride, and the like. These may be used individually or in combination with each other.

The gate electrode GAT may be disposed on the gate insulating layer GI. In an embodiment, the gate electrode GAT may be formed of a metal, an alloy, a conductive metal oxide, a transparent conductive material, or the like. Examples of the material that can be used as the gate electrode GAT may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used individually or in combination with each other.

The interlayer insulating layer ILD may be disposed on the gate insulating layer GI and may cover the gate electrode GAT. In an embodiment, the interlayer insulating layer ILD may be formed of an insulating material. Examples of the insulating material that may be used as the interlayer insulating layer ILD may be silicon oxide, silicon nitride, silicon oxynitride, and the like. These may be used individually or in combination with each other.

The source electrode SE and the drain electrode DE may be disposed on the interlayer insulating layer ILD. In an embodiment, the source electrode SE and the drain electrode DE may electrically contact the active pattern ACT. The source electrode SE and the drain electrode DE may be formed of a metal, an alloy, a conductive metal oxide, a transparent conductive material, or the like.

The via insulating layer VIA may be disposed on the interlayer insulating layer ILD and may cover the source electrode SE and the drain electrode DE. In an embodiment, the via insulating layer VIA may be formed of an organic material. Examples of the organic material may include photoresists, polyacrylic resins, polyimide resins, acrylic resins, and the like. These may be used individually or in combination with each other. Accordingly, the via insulating layer VIA may have a substantially flat upper surface.

Referring back to FIG. 2, the first electrode ADE may be disposed on the via insulating layer VIA. In an embodiment, the first electrode ADE may be electrically connected to the transistor TFT through the drain electrode DE. The first electrode ADE may be formed of a metal, an alloy, a metal oxide, a transparent conductive material, or the like. Examples of the material that can be used as the first electrode ADE may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. These may be used individually or in combination with each other.

The pixel defining layer PDL may be disposed on the via insulating layer VIA. In an embodiment, the pixel defining layer PDL may be formed of an organic material. Examples of the organic material may include photoresists, polyacrylic resins, polyimide resins, acrylic resins, and the like. These may be used individually or in combination with each other. Accordingly, the pixel defining layer PDL may have a substantially flat upper surface. In an embodiment, an opening exposing the first electrode ADE may be formed in the pixel defining layer PDL.

The emission layer EL may be disposed on the first electrode ADE. The emission layer EL may include an organic material emitting light of a selected color. The emission layer EL may emit light based on a potential difference between the first electrode ADE and the second electrode CTE.

The second electrode CTE may be disposed on the emission layer EL. In an embodiment, the second electrode CTE may be formed of a metal, an alloy, a metal oxide, a transparent conductive material, or the like.

The first display insulating layer DIL1 may be disposed on the second electrode CTE. In an embodiment, the first display insulating layer DIL1 may be formed of an inorganic material. Examples of the inorganic material may be silicon oxide, silicon nitride, silicon oxynitride, and the like. These may be used individually or in combination with each other.

In an embodiment, the first display insulating layer DIL1 may have a first thickness TH1. The first thickness TH1 may be in a range of about 1 um to about 1.5 um. For example, the first thickness TH1 may be about 1.2 um. The first display insulating layer DIL1 may have a constant thickness and may be formed along a profile of the second electrode CTE.

The display organic insulating layer DOL may be disposed on the first display insulating layer DIL1. In an embodiment, the display organic insulating layer DOL may be formed of an organic material. Examples of the organic material may be photoresists, polyacrylic resins, polyimide resins, acrylic resins, and the like. These may be used individually or in combination with each other. Accordingly, the display organic insulating layer DOL may have a substantially flat upper surface. In an embodiment, a thickness of the display organic insulating layer DOL may be about 8 um to about 10 um.

The second display insulating layer DIL2 may be disposed on the display organic insulating layer DOL. In an embodiment, the second display insulating layer DIL2 may be formed of an inorganic material. Examples of the inorganic material may be silicon oxide, silicon nitride, silicon oxynitride, and the like. These may be used individually or in combination with each other.

In an embodiment, the second display insulating layer DIL2 and the first display insulating layer DIL1 may be formed of different materials. For example, the first display insulating layer DIL1 may be formed of silicon oxynitride, and the second display insulating layer DIL2 may be formed of silicon nitride.

In an embodiment, a thickness of the second display insulating layer DIL2 may be smaller than the first thickness TH1. For example, the thickness of the second display insulating layer DIL2 may be about 5000 angstroms.

In an embodiment, the first display insulating layer DIL1, the display organic insulating layer DOL, and the second display insulating layer DIL2 may constitute a thin film encapsulation layer. The thin film encapsulation layer may prevent moisture and/or oxygen from penetrating into the emission layer EL.

The third display insulating layer DIL3 may be disposed on the second display insulating layer DIL2. In an embodiment, the third display insulating layer DIL3 may be formed of an inorganic material. Examples of the inorganic material may be silicon oxide, silicon nitride, silicon oxynitride, and the like. These may be used individually or in combination with each other.

In an embodiment, the third display insulating layer DIL3 and the second display insulating layer DIL2 may include a same material. A thickness of the third display insulating layer DIL3 may be smaller than the thickness of the second display insulating layer DIL2, and may be about 2000 angstroms.

The first sensing electrode TM1 may be disposed on the third display insulating layer DIL3. In an embodiment, the first sensing electrode TM1 may be formed of a metal, an alloy, a conductive metal oxide, a transparent conductive material, or the like.

The fourth display insulating layer DIL4 may cover the first sensing electrode TM1 and may be disposed on the third display insulating layer DIL3. In an embodiment, the fourth display insulating layer DIL4 may be formed of an inorganic material. Examples of the inorganic material may be silicon oxide, silicon nitride, silicon oxynitride, and the like. These may be used individually or in combination with each other.

The second sensing electrode TM2 may be disposed on the fourth display insulating layer DIL4. In an embodiment, the second sensing electrode TM2 may be formed of a metal, an alloy, a conductive metal oxide, a transparent conductive material, or the like. In an embodiment, the first sensing electrode TM1 and the second sensing electrode TM2 may be electrically connected to each other and may intersect with each other in a plan view.

The fifth display insulating layer DIL5 may cover the second sensing electrode TM2 and may be disposed on the fourth display insulating layer DIL4. In an embodiment, the fifth display insulating layer DIL5 may be formed of an inorganic material. Examples of the inorganic material may be silicon oxide, silicon nitride, silicon oxynitride, and the like. These may be used individually or in combination with each other.

The refractive member HRF may be disposed on the fifth display insulating layer DIL5. In an embodiment, the refractive member HRF may overlap the emission layer EL. The refractive member HRF may be formed of an organic material. For example, the refractive member HRF may be formed of an organic material having a selected refractive index.

The refractive layer LRF may cover the refractive member HRF and may be disposed on the fifth display insulating layer DIL5. In an embodiment, a refractive index of the refractive member HRF and a refractive index of the refractive layer LRF may be different from each other. For example, the refractive index of the refractive member HRF may be greater than the refractive index of the refractive layer LRF.

Figure 4:
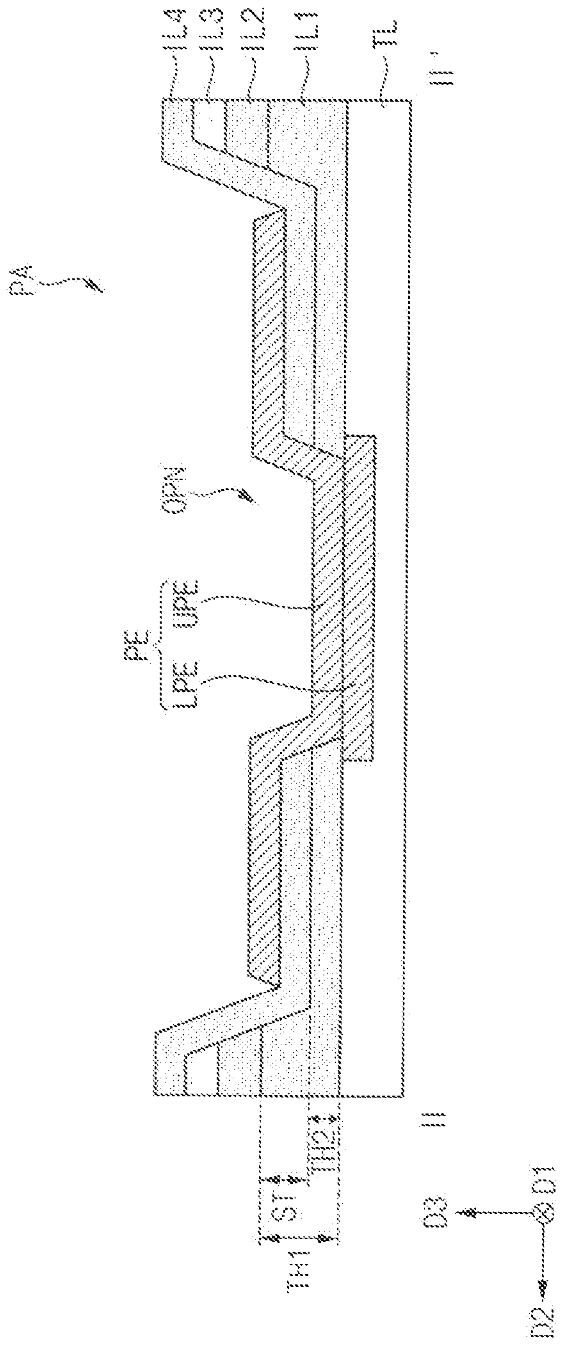
FIG. 4 is a schematic cross-sectional view taken along line II-II' of FIG. 1.

FIG. 4 is a schematic cross-sectional view taken along line II-II' of FIG. 1. For example, FIG. 4 is a schematic cross-sectional view illustrating a pad area of the display device of FIG. 1.

Referring to FIG. 4, a first insulating layer IL1, a second insulating layer IL2, a third insulating layer IL3, a fourth insulating layer IL4, and the pad electrode PE may be disposed in the pad area PA of the display device 10. The pad electrode PE may include a lower electrode LPE and an upper electrode UPE.

In an embodiment, the transistor layer TL may include the lower electrode LPE. The lower electrode LPE may be disposed in the pad area PA. In an embodiment, the lower electrode LPE may be formed together with the transistor TFT. For example, the lower electrode LPE may be formed together with the drain electrode DE, but the embodiments are not limited thereto.

The first insulating layer IL1 may be disposed in the pad area PA on the transistor layer TL. In an embodiment, the first insulating layer IL1 may be formed of an inorganic material. Examples of the inorganic material may be silicon oxide, silicon nitride, silicon oxynitride, and the like. These may be used individually or in combination with each other. In an embodiment, the first insulating layer IL1 and the first display insulating layer DIL1 (refer to FIG. 2) may include a same material.

In an embodiment, the first insulating layer IL1 may have the first thickness TH1. The first insulating layer IL1 and the first display insulating layer DIL1 (refer to FIG. 2) may have the same thickness. As described above, the first thickness TH1 may be in a range of about 1 um to about 1.5 um. For example, the first thickness TH1 may be about 1.2 um.

The first insulating layer IL1 may have a second thickness TH2. In an embodiment, the second thickness TH2 may be smaller than the first thickness TH1. For example, the second thickness TH2 may be about 0.3 um to about 0.8 um. Accordingly, a step ST may be defined in the first insulating layer IL1. For example, the step ST may be defined as a difference between the first thickness TH1 and the second thickness TH2. As described above, according to the size of the step ST, the driving chip may be stably attached to the pad electrode PE. By setting the size of the step ST, the driving chip may be stably attached to the pad electrode PE.

The second insulating layer IL2 may be disposed on the first insulating layer IL1. In an embodiment, the second insulating layer IL2 may be formed of an inorganic material. Examples of the inorganic material may be silicon oxide, silicon nitride, silicon oxynitride, and the like. These may be used individually or in combination with each other.

In an embodiment, the second insulating layer IL2 and the second display insulating layer DIL2 (refer to FIG. 2) may include a same material. The thickness of the second insulating layer IL2 and the thickness of the second display insulating layer DIL2 (refer to FIG. 2) may be substantially equal to each other. The thickness of the second insulating layer IL2 may be smaller than the first thickness TH1 and may be about 5000 angstroms.

The third insulating layer IL3 may be disposed on the second insulating layer IL2. In an embodiment, the third insulating layer IL3 may be formed of an inorganic material. Examples of the inorganic material may be silicon oxide, silicon nitride, silicon oxynitride, and the like. These may be used individually or in combination with each other.

In an embodiment, the third display insulating layer DIL3 (refer to FIG. 2) and the third insulating layer IL3 may include a same material. The thickness of the third insulating layer IL3 and the third display insulating layer DIL3 (refer to FIG. 2) may be substantially equal to each other. The thickness of the third insulating layer IL3 may be about 2000 angstroms.

The fourth insulating layer IL4 may be disposed on the third insulating layer IL3. The fourth insulating layer IL4 may be disposed on the first insulating layer IL1 along the profiles of the third insulating layer IL3 and the second insulating layer IL2.

In an embodiment, the fourth insulating layer IL4 may be formed of an inorganic material. Examples of the inorganic material may be silicon oxide, silicon nitride, silicon oxynitride, and the like. These may be used individually or in combination with each other.

In an embodiment, the fourth insulating layer IL4 and the fourth display insulating layer DIL4 (refer to FIG. 2) may include a same material. The thickness of the fourth insulating layer IL4 and the fourth display insulating layer DIL4 (refer to FIG. 2) may be substantially equal to each other.

The upper electrode UPE may be disposed on the fourth insulating layer IL4. In an embodiment, an opening OPN may be formed in the first to fourth insulating layers IL1, IL2, IL3, and IL4. The thickness of the first insulating layer IL1 may decrease discontinuously towards the opening OPN. For example, the thickness of the first insulating layer IL1 may decrease in a stepwise manner in a direction towards the opening OPN. The opening OPN may overlap the lower electrode LPE and may expose the lower electrode LPE. The upper electrode UPE may electrically contact the lower electrode LPE through the opening OPN.

Figure 5:
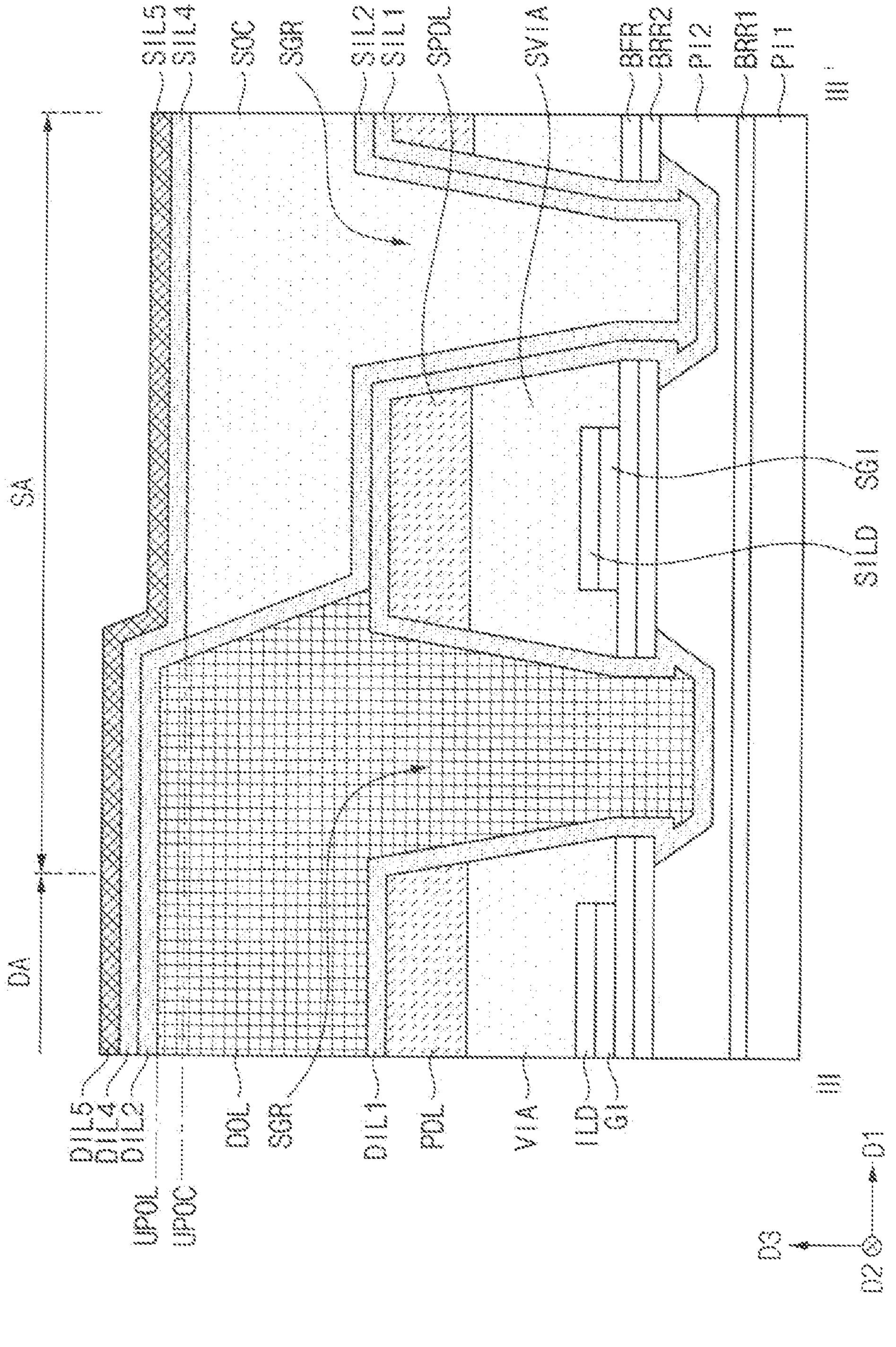
FIG. 5 is a schematic cross-sectional view taken along line III-III' of FIG. 1.

FIG. 5 is a schematic cross-sectional view taken along line III-III' of FIG. 1 that illustrates the surround area SA of the display device of FIG. 1.

Referring to FIG. 5, the first substrate PI1, the first barrier layer BRR1, the second substrate PI2, the second barrier layer BRR2, the buffer layer BFR, a surround gate insulating layer SGI, a surround interlayer insulating layer SILD, a surround via insulating layer SVIA, a surround pixel defining layer SPDL, a first surround insulating layer SIL1, the display organic insulating layer DOL, a surround overcoat layer SOC, a fourth surround insulating layer SIL4, and a fifth surround insulating layer SIL5 may be disposed in the surround area SA of the display device 10.

The surround gate insulating layer SGI and the surround interlayer insulating layer SILD may be formed together with the gate insulating layer GI and the interlayer insulating layer ILD, respectively.

The surround via insulating layer SVIA may be disposed on the buffer layer BFR and may cover the surround gate insulating layer SGI and the surround interlayer insulating layer SILD. In an embodiment, the surround via insulating layer SVIA may be formed of an organic material. Examples of the organic material may include photoresists, polyacrylic resins, polyimide resins, acrylic resins, and the like. These may be used individually or in combination with each other. Accordingly, the surround via insulating layer SVIA may have a substantially flat upper surface. In an embodiment, the surround via insulating layer SVIA and the via insulating layer VIA may include a same material.

The surround pixel defining layer SPDL may be disposed on the surround via insulating layer SVIA. In an embodiment, the surround pixel defining layer SPDL may be formed of an organic material. Examples of the organic material may be photoresists, polyacrylic resins, polyimide resins, acrylic resins, and the like. These may be used individually or in combination with each other. Accordingly, the surround pixel defining layer SPDL may have a substantially flat upper surface. In an embodiment, the surround pixel defining layer SPDL and the pixel defining layer PDL may include a same material.

A surround groove SGR may be formed in the surround via insulating layer SVIA and the surround pixel defining layer SPDL. As described above, the surround groove SGR may prevent the display organic insulating layer DOL from overflowing into the hole area HA. The surround groove SGR may prevent moisture and/or oxygen introduced through the hole area HA from penetrating into the display area DA.

The first surround insulating layer SIL1 may be disposed on the surround pixel defining layer SPDL. In an embodiment, the first display insulating layer DIL1 may extend from the display area DA to the surround area SA, and the first display insulating layer DIL1 extending into the surround area SA may be defined as the first surround insulating layer SIL1. Accordingly, the first surround insulating layer SIL1 and the first display insulating layer DIL1 may include a same material. The thickness of the first surround insulating layer SIL1 and the first display insulating layer DIL1 may be substantially equal to each other and substantially equal to the first thickness TH1 (refer to FIG. 2).

The display organic insulating layer DOL may extend from the display area DA and may fill the surround groove SGR adjacent to the display area DA.

The second surround insulating layer SIL2 may be disposed on the first surround insulating layer SIL1. In an embodiment, the second display insulating layer DIL2 may extend from the display area DA to the surround area SA, and the second display insulating layer DIL2 extending to the surround area SA may be defined as the second surround insulating layer SIL2. Accordingly, the second surround insulating layer SIL2 and the second display insulating layer DIL2 may have the same thickness and may include a same material.

The surround overcoat layer SOC may be disposed on the second surround insulating layer SIL2. In an embodiment, the surround overcoat layer SOC may fill the surround groove SGR adjacent to the hole area HA.

In an embodiment, the surround overcoat layer SOC may be formed of an organic material. Examples of the organic material may be photoresists, polyacrylic resins, polyimide resins, acrylic resins, and the like. These may be used individually or in combination with each other. Accordingly, the surround overcoat layer SOC may have a substantially flat upper surface.

In an embodiment, an upper surface UPOC of the surround overcoat layer SOC may be lower than an upper surface UPOL of the display organic insulating layer DOL. Accordingly, in a region where the surround overcoat layer SOC and the display organic insulating layer DOL contact each other, a step having a reverse taper shape (e.g., a step that tapers towards the display area DA in the surround overcoat layer SOC) may not be formed. For example, in the region where the surround overcoat layer SOC and the display organic insulating layer DOL contact each other, an angle of a taper shape with respect to the first substrate PI1 may be less than about 60 degrees. The angle may be less than about 10 degrees.

The fourth surround insulating layer SIL4 may be disposed on the first surround overcoat layer SOC. In an embodiment, the fourth display insulating layer DIL4 may extend from the display area DA to the surround area SA, and the fourth display insulating layer DIL4 extending to the surround area SA may be defined as the fourth surround insulating layer SIL4. Accordingly, the fourth surround insulating layer SIL4 and the fourth display insulating layer DIL4 may have the same thickness and may include a same material.

The fifth surround insulating layer SIL5 may be disposed on the fourth surround insulating layer SIL4. In an embodiment, the fifth display insulating layer DIL5 may extend from the display area DA to the surround area SA, and the fifth display insulating layer DIL5 extending into the surround area SA may be defined as the fifth surround insulating layer SIL5. Accordingly, the fifth surround insulating layer SIL5 and the fifth display insulating layer DIL5 may have the same thickness and may include a same material.

Figure 6A:
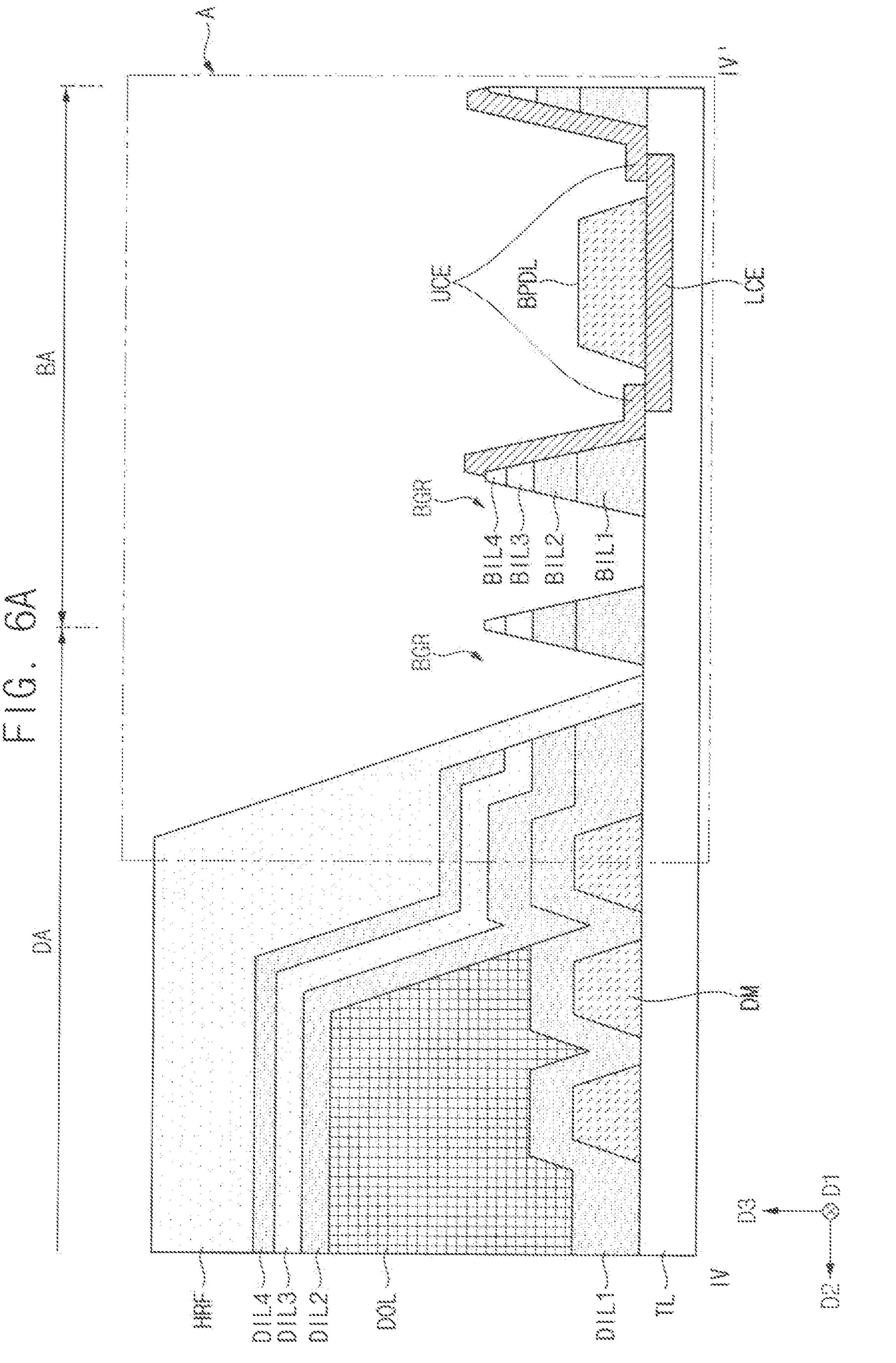
FIG. 6A is a schematic cross-sectional view taken along line IV-IV' of FIG. 1.
Figure 6B:
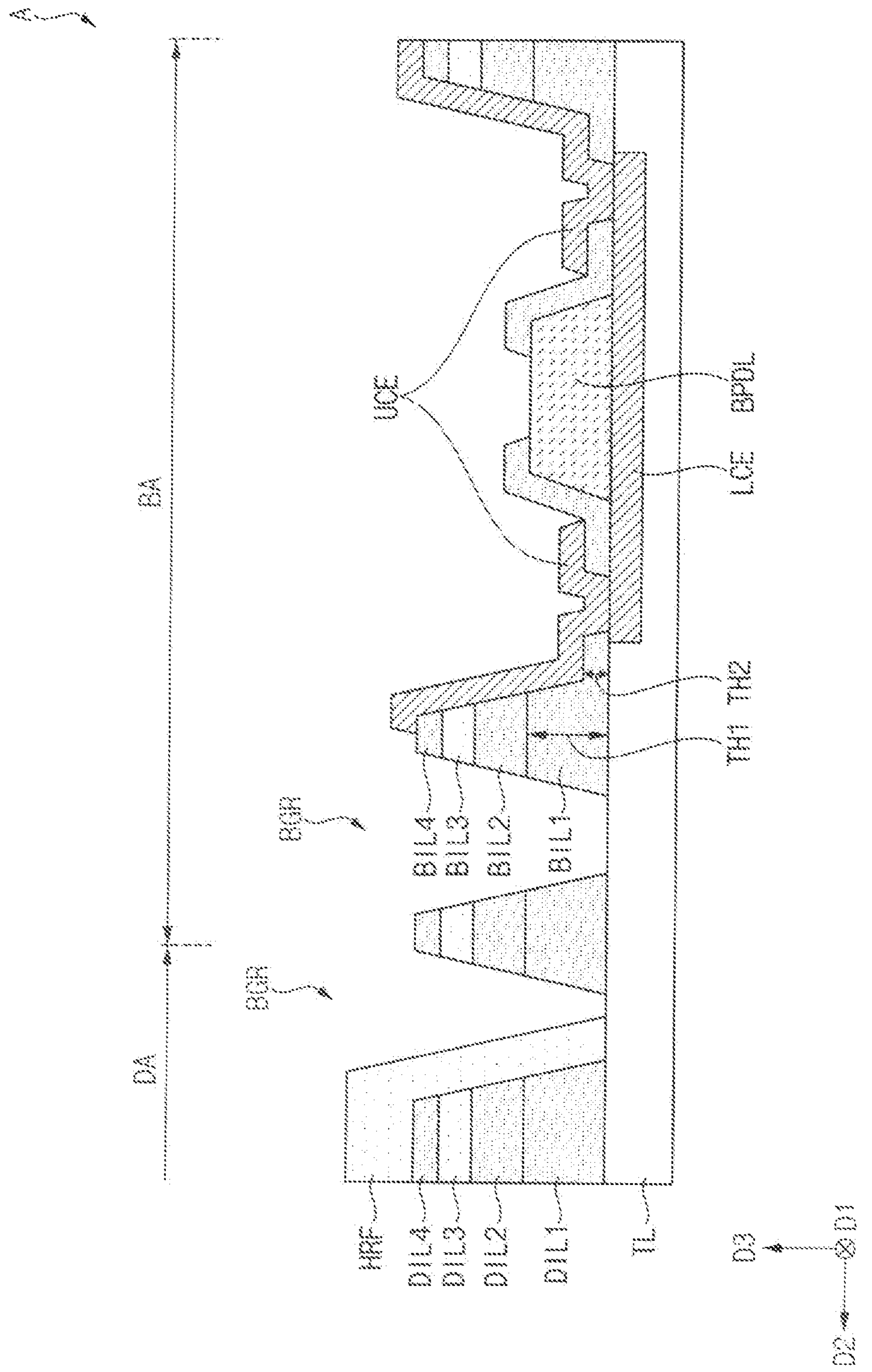
FIG. 6B is a schematic cross-sectional view enlarging area A of FIG. 6A.

FIG. 6A is a schematic cross-sectional view taken along line IV-IV' of FIG. 1. FIG. 6B is a schematic cross-sectional view enlarging area A of FIG. 6A. For example, FIG. 6B is a schematic cross-sectional view illustrating a bending area of the display device of FIG. 1.

Referring to FIG. 6A, at least one dam DM may be disposed in the display area DA adjacent to the bending area BA of the display device 10. In an embodiment, the dam DM may be formed together with at least one of the via insulating layer VIA and the pixel defining layer PDL. The dam DM may prevent the display organic insulating layer DOL from overflowing into the bending area BA.

Referring to FIG. 6B, a lower connecting electrode LCE, a bending pixel defining layer PDL, a first bending insulating layer BIL1, a second bending insulating layer BIL2, a third bending insulating layer BIL3, a fourth bending insulating layer BIL4, an upper connecting electrode UCE, and the refractive member HRF may be disposed in the bending area BA adjacent to the display area DA.

In an embodiment, the transistor layer TL may include the lower connecting electrode LCE. The lower connecting electrode LCE may be disposed in the bending area BA. In an embodiment, the lower connecting electrode LCE may be formed together with the transistor TFT. For example, the lower connecting electrode LCE may be formed together with the drain electrode DE, but the embodiments are not limited thereto.

The bending pixel defining layer BPDL may be disposed on the lower connecting electrode LCE. In an embodiment, the bending pixel defining layer BPDL may be formed of an organic material. Examples of the organic material may be photoresists, polyacrylic resins, polyimide resins, acrylic resins, and the like. These may be used individually or in combination with each other. Accordingly, the bending pixel defining layer BPDL may have a substantially flat upper surface. In an embodiment, the bending pixel defining layer BPDL may include the material same as the pixel defining layer PDL.

The first bending insulating layer BIL1 may be disposed on the transistor layer TL. In an embodiment, the first bending insulating layer BIL1 may be formed of an inorganic material. Examples of the material that can be used as the inorganic material may be silicon oxide, silicon nitride, silicon oxynitride, and the like. These may be used individually or in combination with each other.

In an embodiment, the first bending insulating layer BIL1 and the first display insulating layer DIL1 may include a same material. The first bending insulating layer BIL1 may have the first thickness TH1 and the second thickness TH2.

The second bending insulating layer BIL2 may be disposed on the first bending insulating layer BIL1. In an embodiment, the second bending insulating layer BIL2 may be formed of an inorganic material. Examples of the material that can be used as the inorganic material may be silicon oxide, silicon nitride, silicon oxynitride, and the like. These may be used individually or in combination with each other.

In an embodiment, the second bending insulating layer BIL2 and the second display insulating layer DIL2 may include a same material. The thickness of the second bending insulating layer BIL2 and the thickness of the second display insulating layer DIL2 may be substantially equal to each other.

The third bending insulating layer BIL3 may be disposed on the second bending insulating layer BIL2. In an embodiment, the third bending insulating layer BIL3 may be formed of an inorganic material. Examples of the material that can be used as the inorganic material may be silicon oxide, silicon nitride, silicon oxynitride, and the like. These may be used individually or in combination with each other.

In an embodiment, the third bending insulating layer BIL3 and the third display insulating layer DIL3 may include a same material. The thickness of the third bending insulating layer BIL3 and the thickness of the third display insulating layer DIL3 may be substantially equal to each other.

The fourth bending insulating layer BIL4 may be disposed on the third bending insulating layer BIL3. In an embodiment, the fourth bending insulating layer BIL4 may be formed of an inorganic material. Examples of the material that can be used as the inorganic material may be silicon oxide, silicon nitride, silicon oxynitride, and the like. These may be used individually or in combination with each other.

In an embodiment, the fourth bending insulating layer BIL4 and the fourth display insulating layer DIL4 may include a same material. The thickness of the fourth bending insulating layer BIL4 and the thickness of the fourth display insulating layer DIL4 may be substantially equal to each other.

At least one bending groove BGR may be formed in at least one of the first to fourth bending insulating layers BIL1, BIL2, BIL3, and BIL4.

In an embodiment, the refractive member HRF may be accommodated in the bending groove BGR. The bending groove BGR capable of accommodating the refractive member HRF may be defined in the first to fourth bending insulating layers BIL1, BIL2, BIL3, and BIL4. Accordingly, the bending groove BGR may prevent the refractive member HRF from overflowing into the bending area BA.

In an embodiment, the refractive layer LRF (refer to FIG. 2) may be accommodated in the bending groove BGR. Accordingly, the bending groove BGR may prevent the refractive layer LRF from overflowing into the bending area BA.

The upper connecting electrode UCE may be disposed on the fourth bending insulating layer BIL4, and may be disposed on the first bending insulating layer BIL1 along profiles of the third bending insulating layer BIL3 and the second bending insulating layer BIL2. The upper connecting electrode UCE may contact the lower connecting electrode LCE through an opening formed in the first bending insulating layer BIL1. The upper connecting electrode UCE and the lower connecting electrode LCE may electrically connect the pad area PA and the display area DA.

FIGS. 7 to 16 are schematic cross-sectional views illustrating a method of manufacturing the display device of FIG. 1. For example, schematic cross-sectional views illustrating a display area, a pad area, and a surround area are shown in each of FIGS. 7 to 16.

Figure 7:
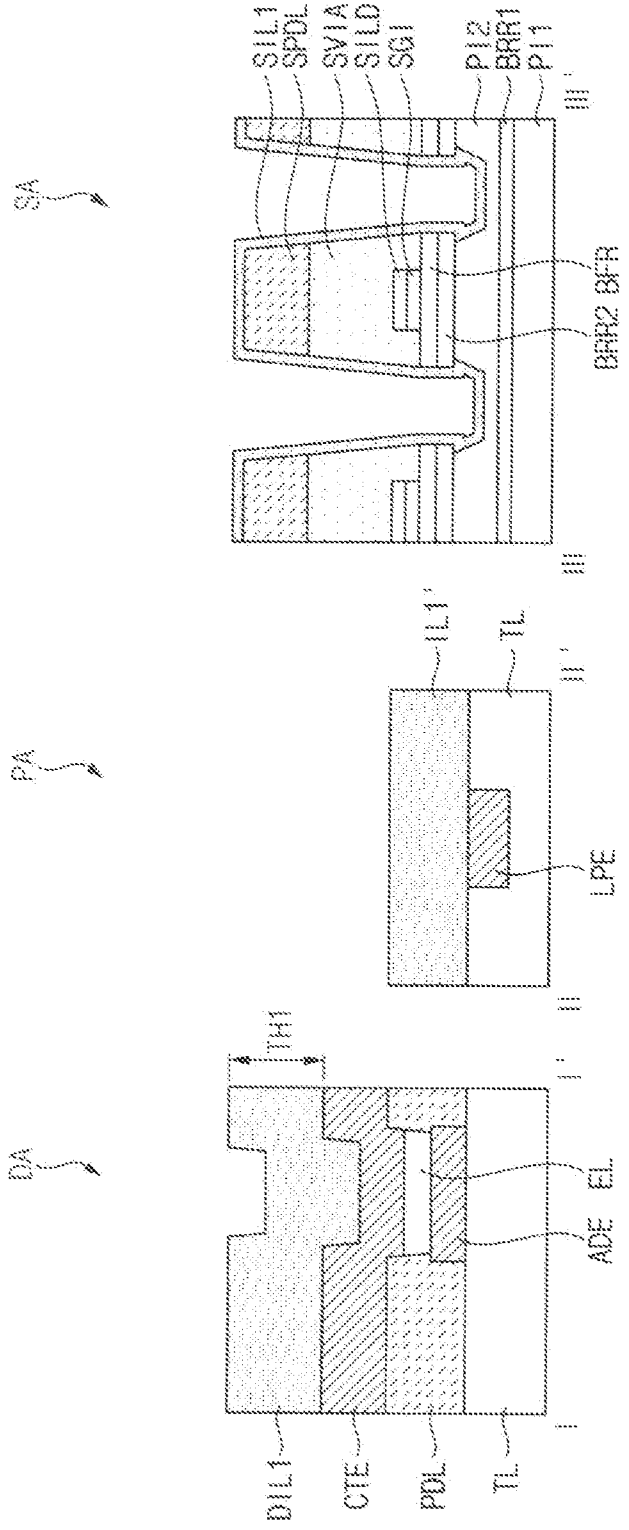
FIGS. 7 to 16 are schematic cross-sectional views illustrating a method of manufacturing the display device of FIG. 1.

Referring to FIG. 7, the emission layer EL and the second electrode CTE may be formed in the display area DA on the transistor layer TL. The transistor layer TL may include the lower electrode LPE in the pad area PA. The surround pixel defining layer SPDL may be formed on the surround via insulating layer SVIA in the surround area SA.

The first display insulating layer DIL1 may be formed on the second electrode CTE. A preliminary first insulating layer IL1' may be formed in the pad area PA on the transistor layer TL. The first surround insulating layer SIL1 may be formed on the surround pixel defining layer SPDL.

In an embodiment, the first display insulating layer DIL1, the preliminary first insulating layer IL1', and the first surround insulating layer SIL1 may be formed together. The first display insulating layer DIL1, the preliminary first insulating layer IL1', and the first surround insulating layer SIL1 may be formed by a deposition process such as chemical vapor deposition ("CVD"), plasma enhanced CVD ("PECVD"), low pressure CVD ("LPCVD"), physical vapor deposition ("PVD"), sputtering, or atomic layer deposition ("ALD"). For example, the first display insulating layer DIL1, the preliminary first insulating layer IL1, and the first surround insulating layer SIL1 may be formed through the chemical vapor deposition ("CVD").

In an embodiment, the first display insulating layer DIL1, the preliminary first insulating layer IL1', and the first surround insulating layer SIL1 may be formed without using a mask. For example, the mask may include an open mask, a halftone mask, a slit mask, a fine metal mask, and the like. As the first display insulating layer DIL1, the preliminary first insulating layer IL1', and the first surround insulating layer SIL1 are formed without using the mask, an insulating layer may be formed in all regions of the display device 10. For example, the preliminary first insulating layer IL1' may be formed in the pad area PA.

As the first display insulating layer DIL1, the preliminary first insulating layer IL1', and the first surround insulating layer SIL1 are formed together, the first display insulating layer DIL1, the preliminary first insulating layer IL1', and the first surround insulating layer SIL1 may include a same material. For example, the first display insulating layer DIL1, the preliminary first insulating layer IL1', and the first surround insulating layer SIL1 may be formed of silicon oxynitride.

The first display insulating layer DIL1, the preliminary first insulating layer IL1', and the first surround insulating layer SIL1 may all have substantially an equal thickness. For example, the first display insulating layer DIL1, the preliminary first insulating layer IL1', and the first surround insulating layer SIL1 may all have the first thickness TH1. For example, the first thickness TH1 may be about 1.2 um.

Figure 8:
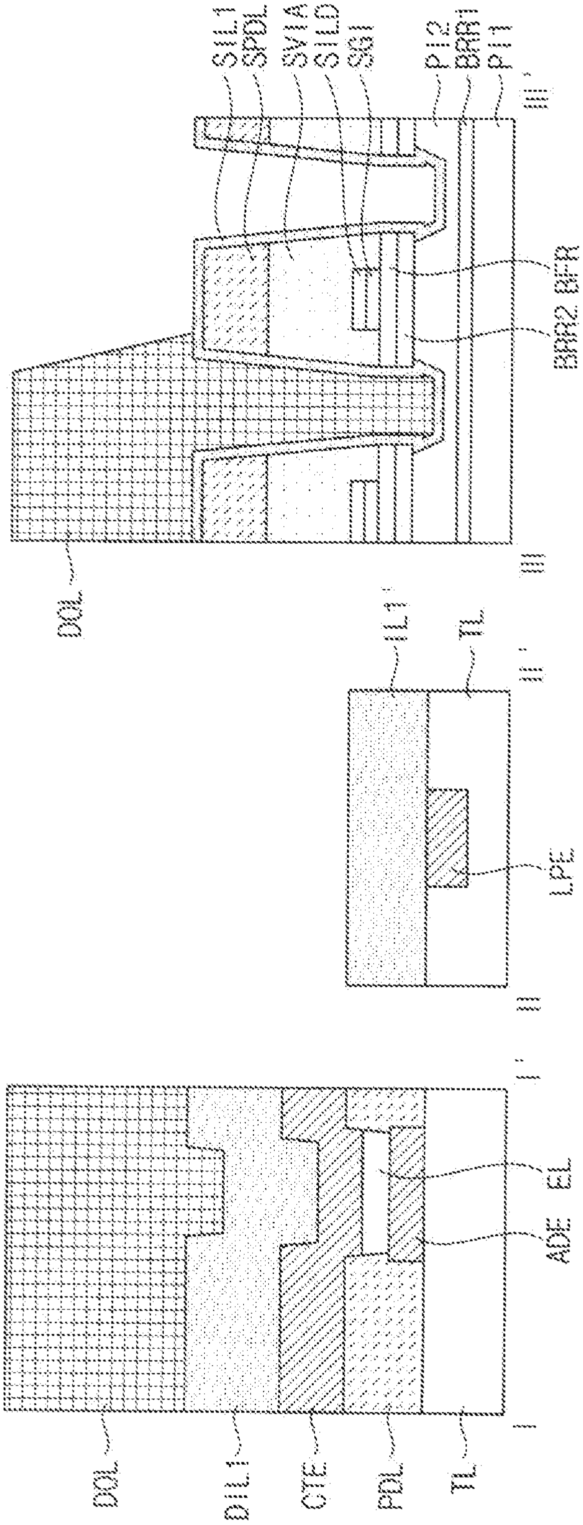

Referring to FIG. 8, the display organic insulating layer DOL may be formed on the first display insulating layer DIL1. As described above, the display organic insulating layer DOL may extend from the display area DA to the surround area SA.

Figure 9:
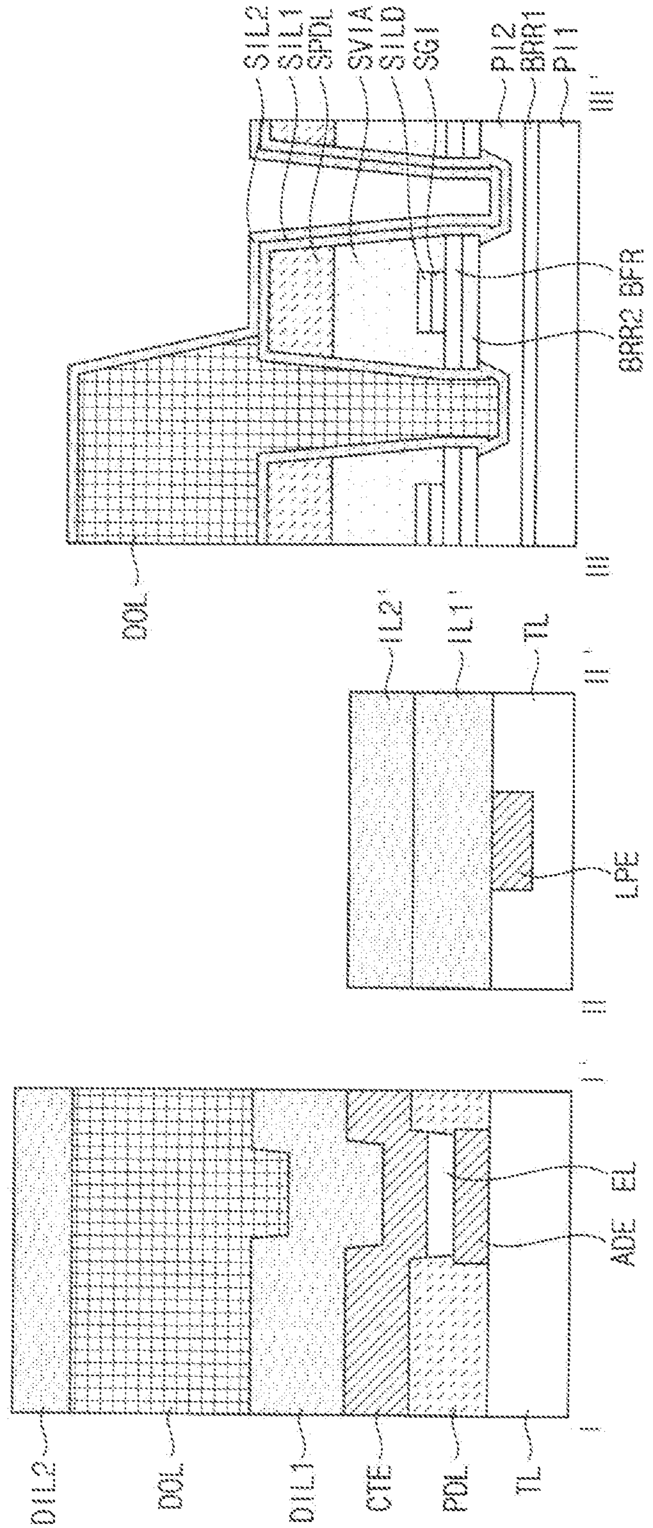

Referring to FIG. 9, the second display insulating layer DIL2 may be formed on the display organic insulating layer DOL. A preliminary second insulating layer IL2' may be formed on the preliminary first insulating layer IL1'. The second surround insulating layer SIL2 may be formed on the first surround insulating layer SIL1.

In an embodiment, the second display insulating layer DIL2, the preliminary second insulating layer IL2', and the second surround insulating layer SIL2 may be formed together. The second display insulating layer DIL2, the preliminary second insulating layer IL2', and the second surround insulating layer SIL2 may be formed by a deposition process such as chemical vapor deposition ("CVD"), plasma enhanced CVD ("PECVD"), low pressure CVD ("LPCVD"), physical vapor deposition ("PVD"), sputtering, or atomic layer deposition ("ALD"). For example, the second display insulating layer DIL2, the preliminary second insulating layer IL2', and the second surround insulating layer SIL2 may be formed through the chemical vapor deposition.

In an embodiment, the second display insulating layer DIL2, the preliminary second insulating layer IL2', and the second surround insulating layer SIL2 may be formed without using a mask. For example, the mask may include an open mask, a halftone mask, a slit mask, a fine metal mask, and the like. As the second display insulating layer DIL2, the preliminary second insulating layer IL2', and the second surround insulating layer SIL2 are formed without using the mask, an insulating layer may be formed in all regions of the display device 10. For example, the preliminary second insulating layer IL2' may be formed in the pad area PA.

As the second display insulating layer DIL2, the preliminary second insulating layer IL2', and the second surround insulating layer SIL2 are formed together, the second display insulating layer DIL2 and the preliminary second insulating layer IL2', and the second surround insulating layer SIL2 may include a same material. For example, the second display insulating layer DIL2, the preliminary second insulating layer IL2', and the second surround insulating layer SIL2 may be formed of silicon nitride.

The second display insulating layer DIL2, the preliminary second insulating layer IL2', and the second surround insulating layer SIL2 may all have a substantially equal thickness. For example, each of a thickness of the second display insulating layer DIL2, a thickness of the preliminary second insulating layer IL2', and a thickness of the second surround insulating layer SIL2 may be about 5000 angstroms.

Figure 10:
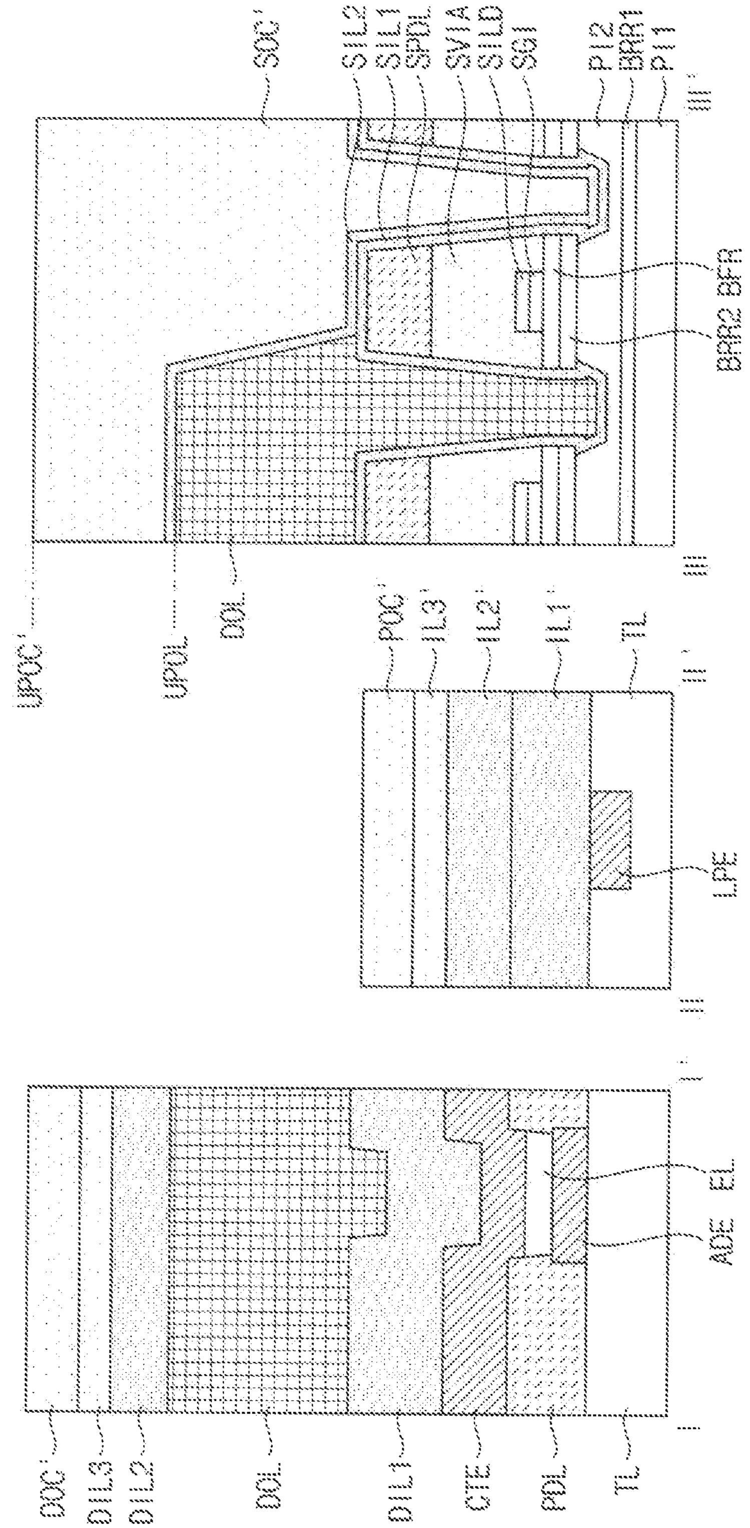

Referring to FIG. 10, the third display insulating layer DIL3 may be formed on the second display insulating layer DIL2. A preliminary third insulating layer IL3' may be formed on the preliminary second insulating layer IL2'.

In an embodiment, the third display insulating layer DIL3 and the preliminary third insulating layer IL3' may be formed together. Accordingly, the third display insulating layer DIL3 and the preliminary third insulating layer IL3' may include a same material and may have a substantially equal thickness. For example, the third display insulating layer DIL3 and the preliminary third insulating layer IL3' may be formed of silicon nitride and may have the thickness of about 2000 angstroms.

A preliminary display overcoat layer DOC' may be formed on the third display insulating layer DIL3. A preliminary pad overcoat layer POC' may be formed on the preliminary third insulating layer IL3'. A preliminary surround overcoat layer SOC' may be formed on the second surround insulating layer SIL2.

In an embodiment, the preliminary display overcoat layer DOC', the preliminary pad overcoat layer POC', and the preliminary surround overcoat layer SOC' may be formed together. For example, the preliminary display overcoat layer DOC', the preliminary pad overcoat layer POC', and the preliminary surround overcoat layer SOC' may be formed by an inkjet printing process.

As the preliminary display overcoat layer DOC', the preliminary pad overcoat layer POC', and the preliminary surround overcoat layer SOC' are formed together, the preliminary display overcoat layer DOC', the preliminary pad overcoat layer POC', and the preliminary surround overcoat layer SOC' may include a same material.

The preliminary display overcoat layer DOC', the preliminary pad overcoat layer POC', and the preliminary surround overcoat layer SOC' may have substantially flat upper surfaces. In an embodiment, an upper surface UPOC' of the preliminary surround overcoat layer SOC' may be higher than an upper surface UPOL of the display organic insulating layer DOL.

Figure 11:
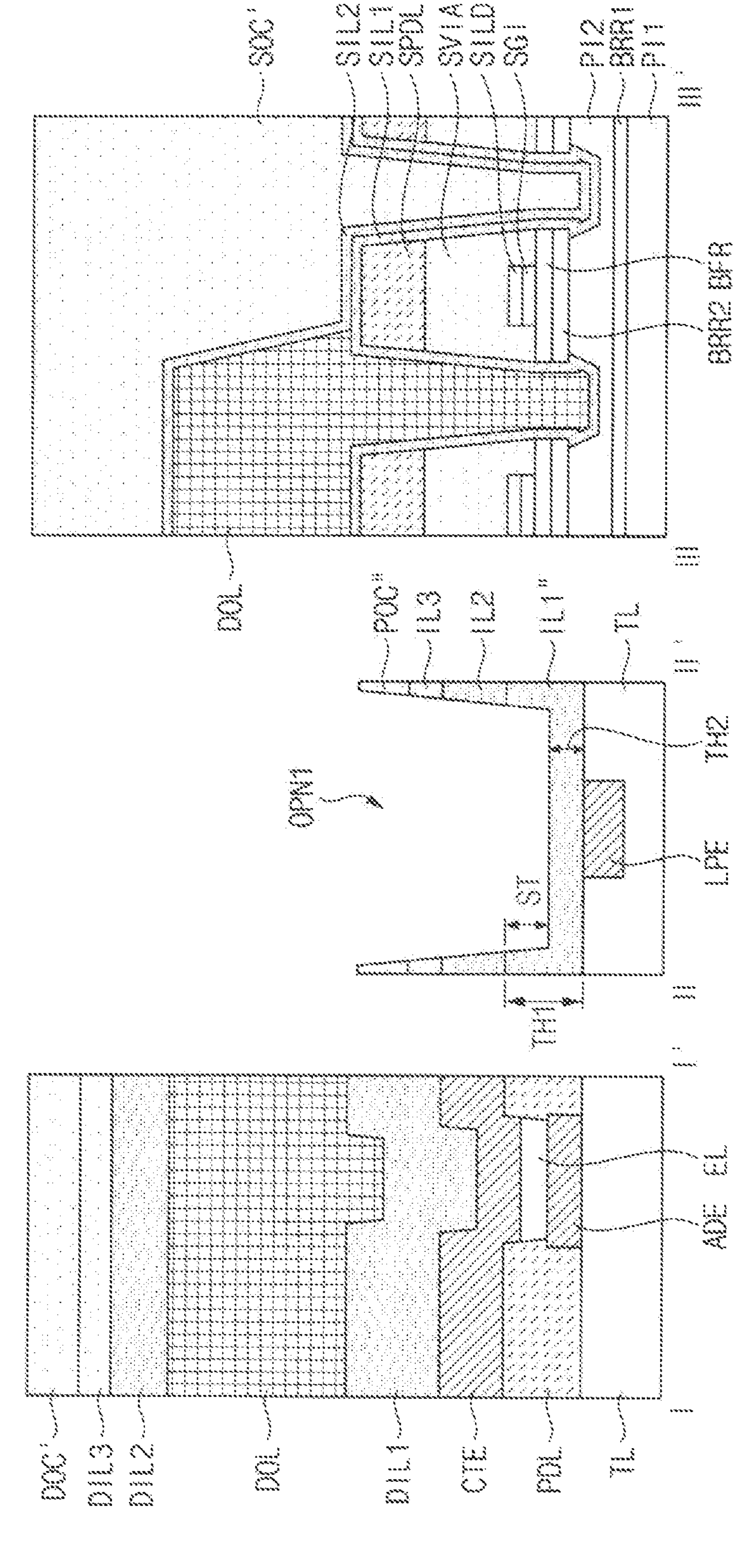

Referring to FIG. 11, the preliminary pad overcoat layer POC', the preliminary third insulating layer IL3', the preliminary second insulating layer IL2', and the preliminary first insulating layer IL1' may be etched. For example, the preliminary pad overcoat layer POC', the preliminary third insulating layer IL3', the preliminary second insulating layer IL2', and the preliminary first insulating layer IL1' may be etched in a thickness direction. The preliminary first insulating layer IL1' may be partially etched.

Accordingly, a first opening OPN1 may be formed. The first opening OPN1 may expose the intermediate first insulating layer IL1". An intermediate pad overcoat layer POC", the third insulating layer IL3, the second insulating layer IL2, and an intermediate first insulating layer IL1" may be formed.

The intermediate first insulating layer IL1" may have the first thickness TH1 and the second thickness TH2, and the step ST may be defined in the intermediate first insulating layer IL1". The step ST may be defined as a difference between the first thickness TH1 and the second thickness TH2.

The step ST may be set based on an etching amount of the preliminary first insulating layer IL1'. For example, when the etching amount of the preliminary first insulating layer IL1' increases, the second thickness TH2 may decrease. Accordingly, the step ST may increase. In other examples, when the etching amount of the preliminary first insulating layer IL1' decreases, the second thickness TH2 may increase. Accordingly, the step ST may decrease.

As described above, by setting the size of the step ST, the driving chip may be stably attached to the upper electrode UPE.

Although FIG. 11 shows a structure in which the step ST is formed in the intermediate first insulating layer IL1", the embodiments are not limited thereto. In other examples, the step ST may be formed in the second insulating layer IL2. The preliminary second insulating layer IL2' may be partially etched, and the first opening OPN1 may expose the second insulating layer IL2.

Figure 12:
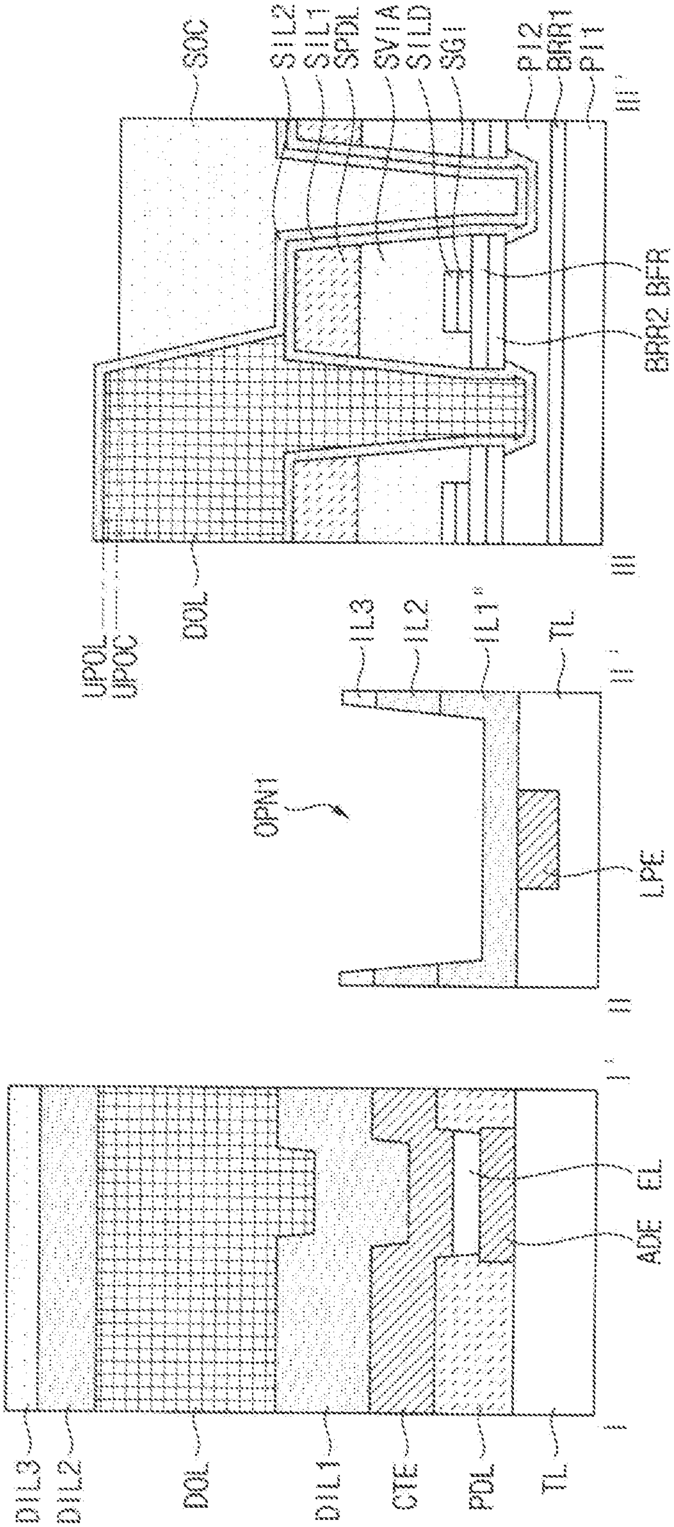

Referring to FIG. 12, all of the preliminary display overcoat layer DOC' and the intermediate pad overcoat layer POC" may be removed. The preliminary surround overcoat layer SOC' may be partially removed. In an embodiment, the preliminary display overcoat layer DOC', the intermediate pad overcoat layer POC", and the preliminary surround overcoat layer SOC' may be removed through an ashing process.

Accordingly, the surround overcoat layer SOC may be formed in the surround area SA. In an embodiment, the upper surface UPOC of the surround overcoat layer SOC may be lower than the upper surface UPOL of the display organic insulating layer DOL.

Figure 13:
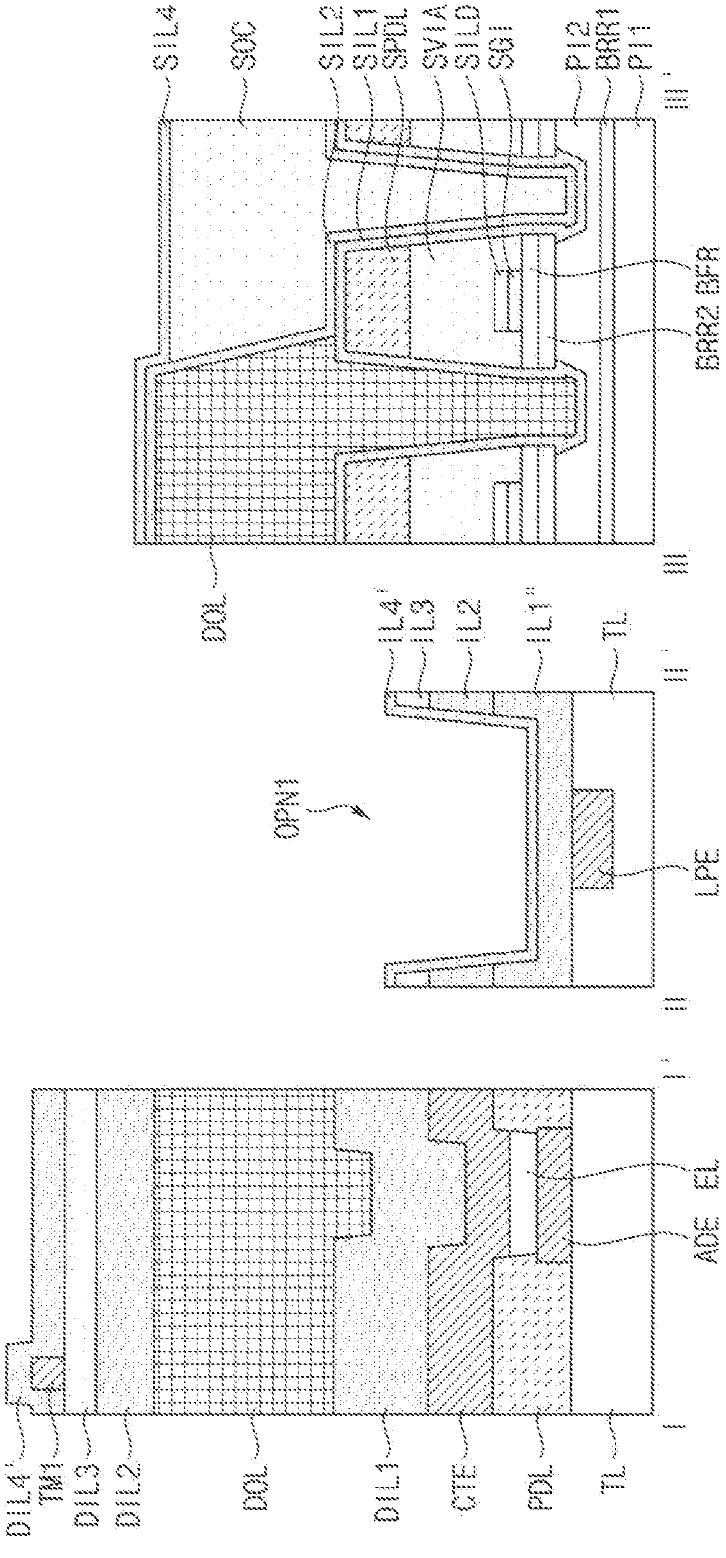

Referring to FIG. 13, the first sensing electrode TM1 may be formed on the third display insulating layer DIL3, and a preliminary fourth display insulating layer DIL4' covering the first sensing electrode TM1 may be formed. A preliminary fourth insulating layer IL4' may be formed on the third insulating layer IL3. The fourth surround insulating layer SIL4 may be formed on the surround overcoat layer SOC.

In an embodiment, the fourth preliminary display insulating layer DIL4', the preliminary fourth insulating layer IL4', and the fourth surround insulating layer SIL4 may be formed together. Accordingly, the preliminary fourth display insulating layer DIL4', the preliminary fourth insulating layer IL4', and the fourth surround insulating layer SIL4 may include a same material and may have a substantially equal thickness.

Figure 14:
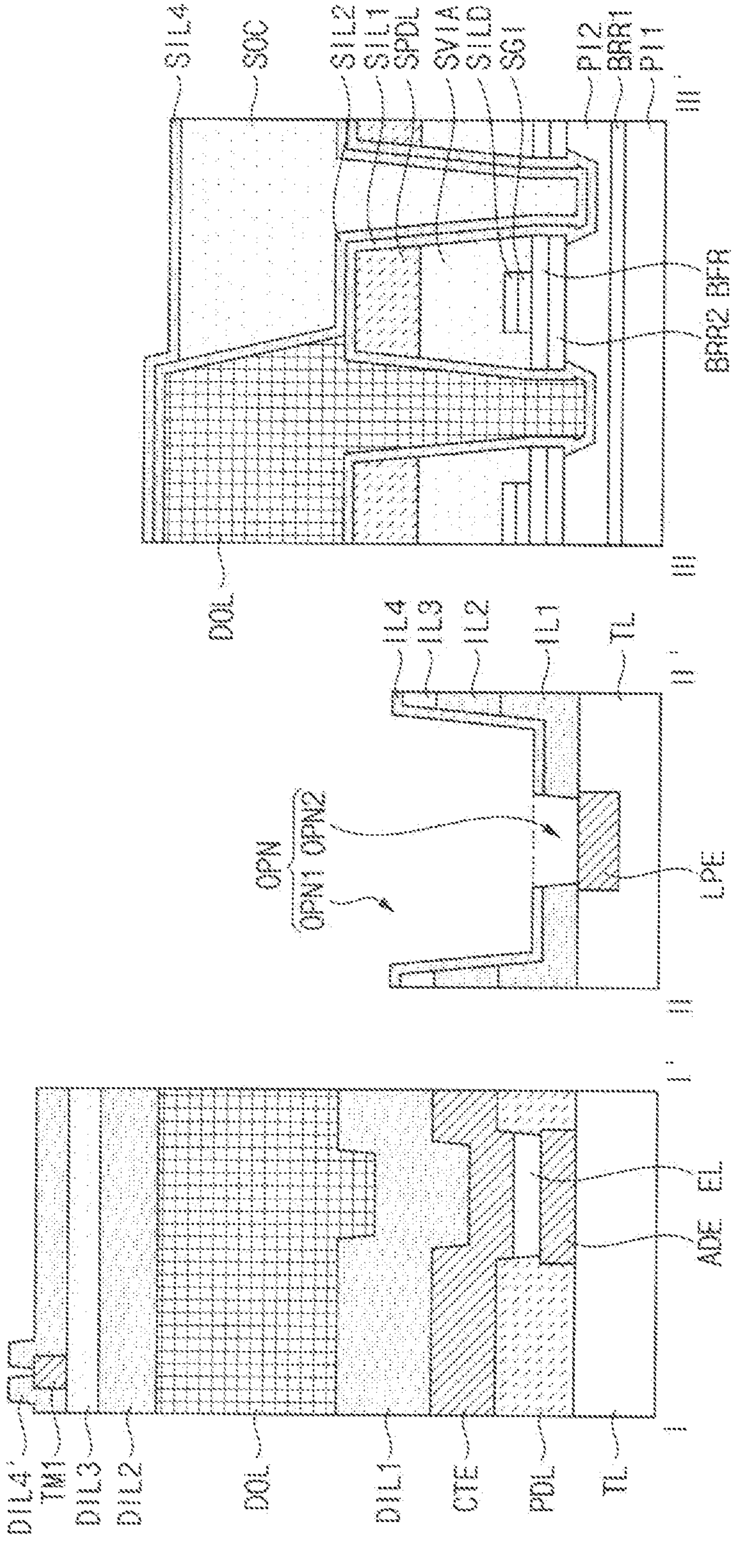

Referring to FIG. 14, the fourth display insulating layer DIL4 may be formed by etching the preliminary fourth display insulating layer DIL4' in the thickness direction. The fourth insulating layer IL4 and the first insulating layer IL1 may be formed by etching the preliminary fourth insulating layer IL4' and the intermediate first insulating layer IL1" in the thickness direction. In an embodiment, the preliminary fourth display insulating layer DIL4', the preliminary fourth insulating layer IL4', and the intermediate first insulating layer IL1" may be etched together.

Accordingly, a second opening OPN2 may be formed. The first opening OPN1 and the second opening OPN2 may constitute the opening OPN described in FIG. 4. The second opening OPN2 may expose the lower electrode LPE. The intermediate first insulating layer IL1" may be etched to expose the lower electrode LPE.

Figure 15:
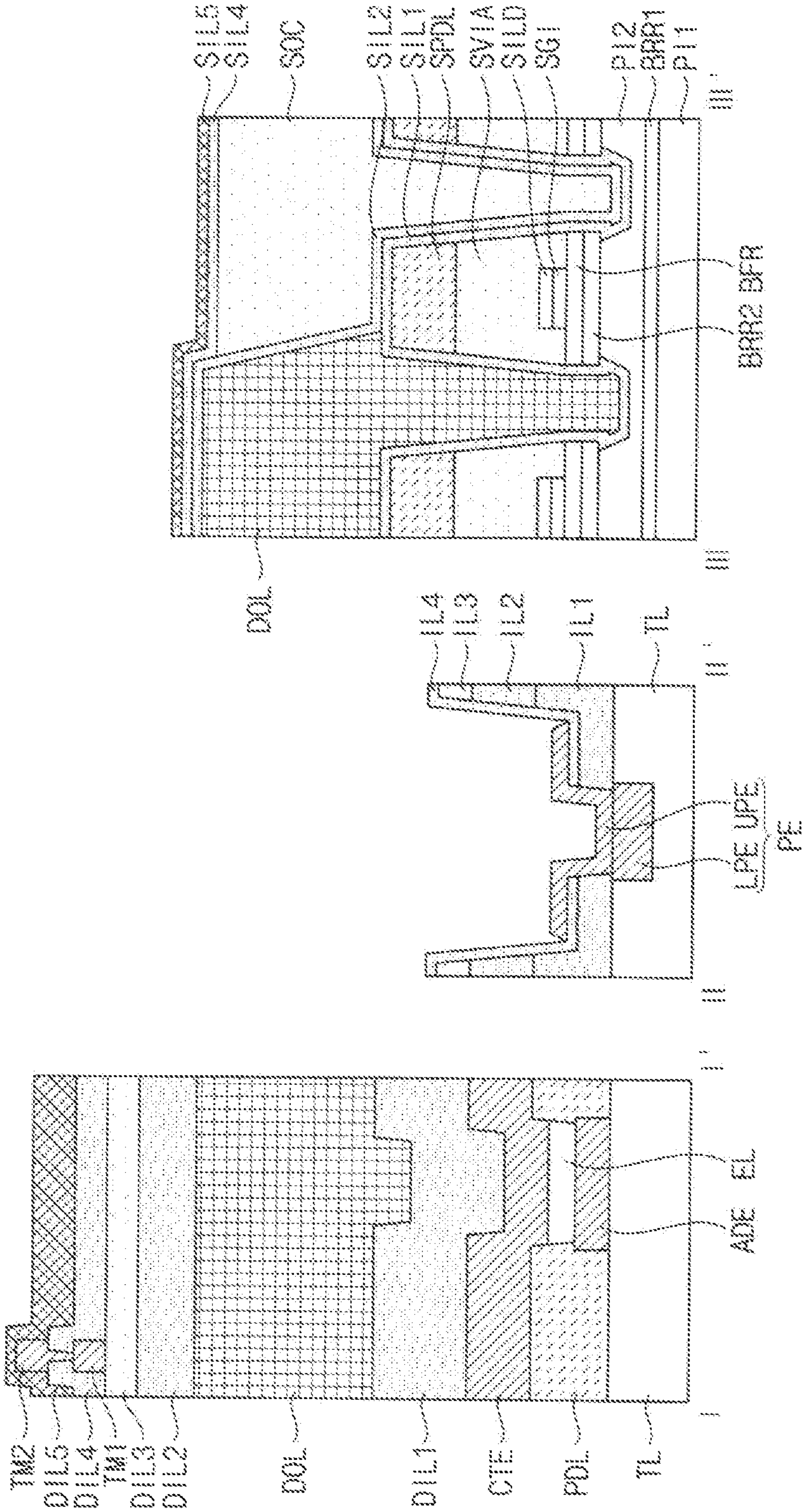

Referring to FIG. 15, the second sensing electrode TM2 may be formed on the fourth display insulating layer DIL4. The upper electrode UPE may be formed on the fourth insulating layer IL4. In an embodiment, the second sensing electrode TM2 and the upper electrode UPE may be formed together. The upper electrode UPE may electrically contact the lower electrode LPE through the second opening OPN2.

The fifth display insulating layer DIL5 may be formed on the second sensing electrode TM2, and the fifth surround insulating layer SIL5 may be formed on the fourth surround insulating layer SIL4. In an embodiment, the fifth display insulating layer DIL5 and the fifth surround insulating layer SIL5 may be formed together.

Figure 16:
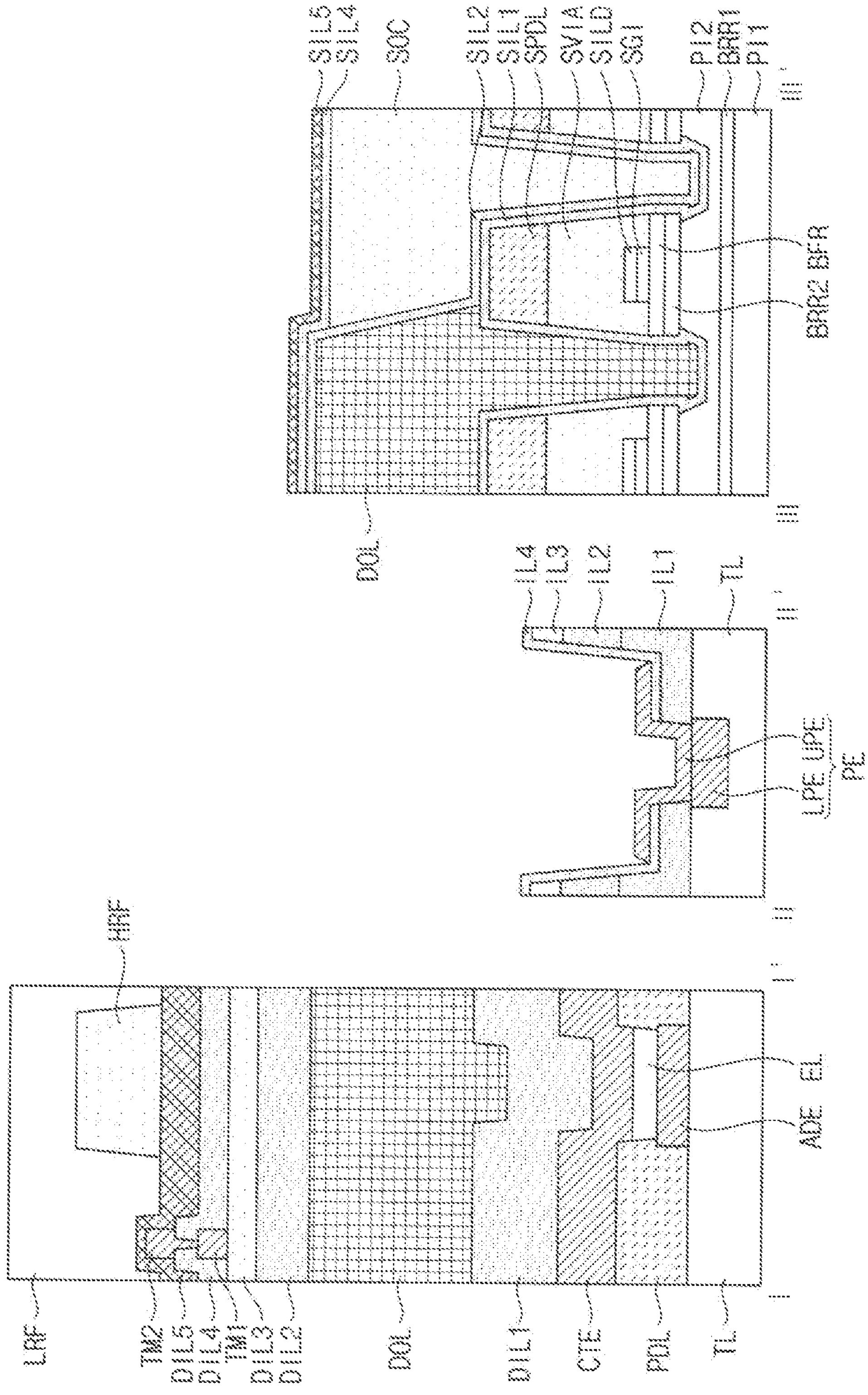

Referring to FIG. 16, the refractive member HRF and the refractive layer LRF may be formed on the fifth display insulating layer DIL5.

In the method of manufacturing the display device 10 according to an embodiment, the first display insulating layer DIL1, the preliminary first insulating layer IL1', and the first surround insulating layer SIL1 may be formed together. The first display insulating layer DIL1, the preliminary first insulating layer IL1', and the first surround insulating layer SIL1 may be formed without using a mask.

The second display insulating layer DIL2, the preliminary second insulating layer IL2', and the second surround insulating layer SIL2 may be formed together. The second display insulating layer DIL2, the preliminary second insulating layer IL2', and the second surround insulating layer SIL2 may be formed without using a mask.

As the first display insulating layer DIL1, the preliminary first insulating layer IL1', the first surround insulating layer SIL1, the second display insulating layer DIL2, the preliminary second insulating layer IL2', and the second surround second insulating layer SIL2 are formed without using the mask, the display device 10 may be produced efficiently.

In the embodiments, a shadow that may form when using a mask may not be formed in the display device 10. Since processing to prevent film lifting phenomena due to the shadow may not be required, dead space of the display device 10 may be reduced. The costs associated with the mask (e.g., the cost of manufacturing the mask, the cost of managing the mask, etc.) may be reduced.

Also, in the method of manufacturing the display device 10, the preliminary surround overcoat layer SOC' is formed before the surround overcoat layer SOC may be formed. Therefore, the upper surface UPOC' of the surround overcoat layer SOC' may be higher than the upper surface UPOL of the display organic insulating layer DOL. The surround overcoat layer SOC may be formed by removing a portion of the preliminary overcoat layer SOC', and the upper surface UPOC of the surround overcoat layer SOC may be lower than the upper surface UPOL of the display organic insulating layer DOL. Accordingly, in a region where the surround overcoat layer SOC and the display organic insulating layer DOL contact each other, a step having a reverse taper shape (for example, having a slope of the surround overcoat layer SOC that may be inclined downwards towards the display area DA from the surround area SA) may not be formed.

Figure 17:
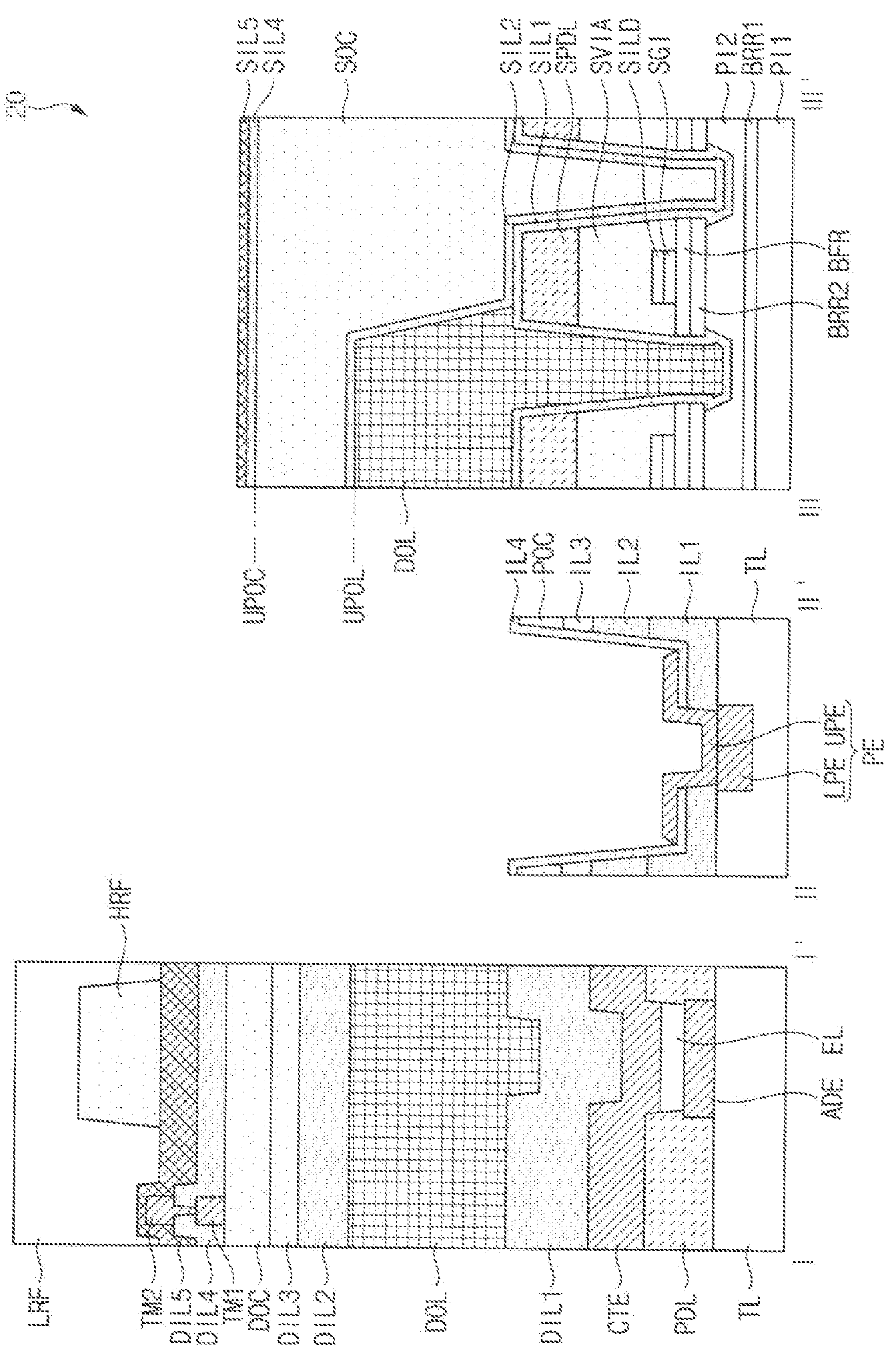
FIG. 17 is a schematic cross-sectional view illustrating a display device according to an embodiment.

FIG. 17 is a schematic cross-sectional view illustrating a display device according to an embodiment. For example, schematic cross-sectional views illustrating a display area, a pad area, and a surround area are shown in FIG. 17.

Referring to FIG. 17, a display device 20 according to an embodiment may include a display overcoat layer DOC, a pad overcoat layer POC, and a surround overcoat layer SOC. However, the display device 20 may be substantially the same as the display device 10 described with reference to FIG. 16, except for the display overcoat layer DOC, the pad overcoat layer POC, and the surround overcoat layer SOC.

The display overcoat layer DOC, the pad overcoat layer POC, and the surround overcoat layer SOC may substantially correspond to the preliminary display overcoat layer DOC', the preliminary pad overcoat layer POC', and the preliminary surround overcoat layer SOC', respectively. In the method of manufacturing the display device 20, the preliminary display overcoat layer DOC', the preliminary pad overcoat layer POC', and the preliminary surround overcoat layer SOC' described with reference to FIG. 10 may not be removed. Accordingly, in the display device 20, an upper surface UPOC of the surround overcoat layer SOC may be higher than an upper surface UPOL of the display organic insulating layer DOL. Accordingly, in a region where the surround overcoat layer SOC and the display organic insulating layer DOL contact each other, a step having a reverse taper shape (e.g., a step that tapers towards the display area DA in the surround overcoat layer SOC) may not be formed.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:

a transistor layer including:

a display area; and a pad area disposed adjacent to the display area;

an emission layer disposed in the display area on the transistor layer;

a first display insulating layer disposed on the emission layer; and an insulating layer disposed in the pad area on the transistor layer, the insulating layer and the first display insulating layer including a same material, and the insulating layer having a step;

a display organic insulating layer disposed on the first display insulating layer; and an overcoat layer having an upper surface lower than an upper surface of the display organic insulating layer, wherein the display area includes:

a hole area; and a surround area surrounding the hole area, and the overcoat layer is disposed in the surround area on the transistor layer.

2. The display device of claim 1, further comprising:

a refractive member disposed on the first display insulating layer, the refractive member including an organic material.

3. The display device of claim 1, wherein the insulating layer has a first thickness and a second thickness smaller than the first thickness, the step is a difference between the first thickness and the second thickness, and the first display insulating layer has the first thickness.

4. The display device of claim 3, wherein the first thickness is in a range of about 1 um to about 1.5 um, and the second thickness is in a range of about 0.3 um to about 0.8 um.

5. The display device of claim 1, wherein the transistor layer includes a lower electrode disposed in the pad area, and an opening overlapping the lower electrode in a plan view is defined in the insulating layer.

6. The display device of claim 5, wherein a thickness of the insulating layer decreases discontinuously towards the opening.

7. The display device of claim 5, further comprising:

an upper electrode disposed on the insulating layer and electrically contacting the lower electrode through the opening.

8. The display device of claim 1, further comprising:

a second display insulating layer disposed on the display organic insulating layer; and a second surround insulating layer disposed under the overcoat layer, the second surround insulating layer and the second display insulating layer including a same material.

9. A display device comprising:

a transistor layer including:

a display area; and a pad area disposed adjacent to the display area;

an emission layer disposed in the display area on the transistor layer;

a first display insulating layer disposed on the emission layer; and an insulating layer disposed in the pad area on the transistor layer, the insulating layer and the first display insulating layer including a same material, and the insulating layer having a step, a bending insulating layer disposed in a bending area, the bending insulating layer and the insulating layer including a same material; and a refractive member disposed on the first display insulating layer, the refractive member including an organic material, wherein a groove that accommodates the refractive member is disposed in the bending insulating layer.

* * * * *